US012584971B2

(12) United States Patent     (10) Patent No.:   US 12,584,971 B2

Matthey et al.     (45) Date of Patent:    Mar. 24, 2026

(54) BATTERY MANAGEMENT APPARATUS, BATTERY MANAGEMENT METHOD, AND BATTERY ENERGY STORAGE SYSTEM

(71) Applicant: VEHICLE ENERGY JAPAN INC., Hitachinaka (JP)

(72) Inventors: Fanny Matthey, Tokyo (JP); Ryohhei Nakao, Tokyo (JP); Kei Sakabe, Ibaraki (JP); Hironori Sasaki, Ibaraki (JP)

(73) Assignee: VEHICLE ENERGY JAPAN INC., Hitachinaka (JP)

( * ) Notice: Subject to any disclaimer, the term of this patent is extended or adjusted under 35 U.S.C. 154(b) by 881 days.

(21) Appl. No.: 17/797,510

(22) PCT Filed: Sep. 18, 2020

(86) PCT No.: PCT/JP2020/035633

§ 371 (c)(1),
(2) Date: Apr. 26, 2023

(87) PCT Pub. No.: WO2021/157120

PCT Pub. Date: Aug. 12, 2021

(65) Prior Publication Data

US 2024/0183912 A1    Jun. 6, 2024

(30) Foreign Application Priority Data

Feb. 4, 2020    (JP) ................................. 2020-016897

(51) Int. Cl.
   *G01R 31/392*     (2019.01)
   *G01R 31/367*     (2019.01)
   (Continued)

(52) U.S. Cl.
   CPC ......... *G01R 31/392* (2019.01); *G01R 31/367* (2019.01); *G01R 31/374* (2019.01);
   (Continued)

(58) Field of Classification Search
   CPC ................ G01R 31/392; G01R 31/367; G01R 31/374; G01R 31/387; G01R 31/389;
      (Continued)

(56) References Cited

U.S. PATENT DOCUMENTS 9,037,327 B2    5/2015   Kim
2006/0022676 A1*   2/2006   Uesaka .............. G01R 31/3828
                    324/429
            (Continued)

FOREIGN PATENT DOCUMENTS

EP        3086133 A1    10/2016
JP     2015122909 A   *   7/2015   ............. Y02E 60/10

OTHER PUBLICATIONS

Extended European Search Report issued on Jul. 3, 2023 for European Patent Application No. 20918101.5.
           (Continued)

*Primary Examiner* — Catherine T. Rastovski
*Assistant Examiner* — Lal Ce Mang
(74) *Attorney, Agent, or Firm* — Volpe Koenig

(57)            ABSTRACT

A battery management apparatus 102 calculates a state of charge SOC representing the state of charge of a chargeable and dischargeable battery, a charge deterioration degree SOHQ and a resistance deterioration degree SOHR, corrects the calculated SOHR, corrects an mid resistance MidDCR corresponding to a mid voltage MidVoltage according to a correction coefficient in accordance with SOHR for MidDCR (corrected SOHR), calculates MidVoltage (a mid voltage present between a discharge voltage in the current state of charge of the battery, and a voltage value representing a discharge voltage in the minimum state of charge of the battery), calculates the remaining capacity of the battery (Continued)

based on SOC and SOHQ, and calculates the available energy of the battery based on the mid voltage and the remaining capacity.

13 Claims, 12 Drawing Sheets

(51) Int. Cl.
| | |
|---|---|
| *G01R 31/374* | (2019.01) |
| *G01R 31/387* | (2019.01) |
| *G01R 31/389* | (2019.01) |
| *H01M 10/44* | (2006.01) |
| *H01M 10/48* | (2006.01) |
| *H01M 10/42* | (2006.01) |

(52) U.S. Cl.
CPC ......... *G01R 31/387* (2019.01); *G01R 31/389* (2019.01); *H01M 10/44* (2013.01); *H01M 10/48* (2013.01); *H01M 2010/4271* (2013.01)

(58) Field of Classification Search
CPC .... G01R 31/382; H01M 10/44; H01M 10/48; H01M 10/425; H01M 10/42; H01M 2010/4271; H02J 7/0048; H02J 7/00716; H02J 7/007182; H02J 7/007192; Y02E 60/10

See application file for complete search history.

(56) References Cited

U.S. PATENT DOCUMENTS

| | | | | |
|---|---|---|---|---|
| 2012/0306450 | A1* | 12/2012 | Nakayama ........... | G01R 31/382 320/134 |
| 2014/0222358 | A1* | 8/2014 | Morita ................. | G01R 31/396 702/63 |
| 2016/0372935 | A1* | 12/2016 | Sakata .................... | H02J 7/005 |
| 2017/0126052 | A1* | 5/2017 | Toki .......................... | H02J 7/04 |
| 2017/0170684 | A1* | 6/2017 | Matthey ................. | H02J 7/005 |
| 2019/0004115 | A1* | 1/2019 | Nakamura ........... | G01R 31/392 |

OTHER PUBLICATIONS

International Search Report of PCT/JP2020/035633 dated Dec. 15, 2020 with English Translation.

* cited by examiner

BATTERY MANAGEMENT APPARATUS, BATTERY MANAGEMENT METHOD, AND BATTERY ENERGY STORAGE SYSTEM

TECHNICAL FIELD

The present invention relates to a battery management apparatus, a battery management method, and a battery energy storage system.

BACKGROUND ART

In recent years, in view of the global warming problem, there has been an increased use of a power generation and transmission system that is intended to generate power by using renewable energy, such as sunlight and wind power, and stabilize the output by using a battery energy storage system (BESS). In view of emission control, such a battery energy storage system is widely used also for a mobile traffic system, such as of automobiles.

A conventional, typical battery energy storage system includes: a battery that includes multiple battery cells combined with each other; a cooling system that cools the battery to regulate the temperature; a battery management apparatus that performs charge and discharge control and maintains the system in a safe state.

Battery energy storage systems mounted on electric vehicles, hybrid vehicles and the like are required to correctly obtain battery states, such as a state of charge (SOC), a state of health (SOH), and the maximum permissible power, in order to facilitate to optimize vehicle control while maintaining the battery in the safe state. These battery states are obtained based on measured values, such as current, voltage and temperature, through sensors. One of the battery states used for such battery energy storage systems is available energy. The available energy represents the total amount of electrical energy remaining in the battery, and corresponds to electrical energy that can be discharged until the battery reaches a permissible use limit. The available energy is used to calculate the travelable distance of a vehicle until the battery reaches a fully discharged (use limit) state, for example.

As for calculation of the available energy of a battery, a technique described in Patent Literature 1 has been known. Patent Literature 1 discloses a method including: obtaining a battery's initial available energy; calculating the battery's accumulative consumption energy consumed while a vehicle is travelling a current accumulative driving distance; calculating the battery's remaining available energy from these values; calculating a final electric efficiency corresponding to driving the current accumulative driving distance; and calculating a travelable distance of the vehicle.

CITATION LIST

Patent Literature

Patent Literature 1: U.S. Pat. No. 9,037,327

SUMMARY OF INVENTION

Technical Problem

According to the method in Patent Literature 1, during calculation of the accumulative consumption energy of the battery, the errors of a voltage sensor and a current sensor are accumulated. Accordingly, in particular, after the vehicle travels a long distance, it is difficult to correctly estimate the available energy of the battery.

Solution to Problem

A battery management apparatus according to the present invention is for managing a chargeable and dischargeable battery, the apparatus including: a battery state calculator that calculates a state of charge, a capacity deterioration degree, and a resistance deterioration degree of the battery; a mid voltage calculator that corrects the calculated resistance deterioration degree, corrects a mid resistance of the battery corresponding to the mid voltage according to a correction coefficient in accordance with the corrected resistance deterioration degree, and calculates a mid voltage that is present between a charge-discharge voltage in a current state of charge of the battery, and a charge-discharge voltage in a minimum state of charge or a maximum state of charge of the battery, based on the corrected mid resistance; a remaining capacity calculator that calculates a remaining capacity or a chargeable capacity of the battery, based on the state of charge and the capacity deterioration degree; and an available energy calculator that calculates available energy or chargeable energy of the battery, based on the mid voltage and the remaining capacity, or on the mid voltage and the chargeable capacity.

A battery management method according to the present invention is a method for managing a chargeable and dischargeable battery, the method including, by a computer: calculating a state of charge, a capacity deterioration degree and a resistance deterioration degree of the battery; correcting the calculated resistance deterioration degree; correcting a mid resistance of the battery corresponding to the mid voltage, according to a correction coefficient in accordance with the corrected resistance deterioration degree; calculating a mid voltage that is present between a charge-discharge voltage in a current state of charge of the battery, and a charge-discharge voltage in a minimum state of charge or a maximum state of charge of the battery, based on the corrected mid resistance; calculating a remaining capacity or a chargeable capacity of the battery, based on the calculated state of charge and deterioration degree; and calculating available energy or chargeable energy of the battery, based on the calculated mid voltage and remaining capacity, or on the calculated mid voltage and chargeable capacity.

A battery energy storage system according to the present invention includes: the battery management apparatus; a chargeable and dischargeable battery; and a charge-discharge apparatus that charges and discharges the battery, based on available energy or chargeable energy of the battery calculated by the battery management apparatus.

Advantageous Effect of Invention

The present invention can correctly estimate the available energy of the battery.

BRIEF DESCRIPTION OF DRAWINGS

FIG. 5 shows functional blocks of a battery state calculator.

FIG. 11 shows functional blocks of the battery management apparatus pertaining to an available energy calculation process according to a third embodiment of the present invention.

DESCRIPTION OF EMBODIMENTS

Embodiments of the present invention are hereinafter described.

First Embodiment

Figure 1:
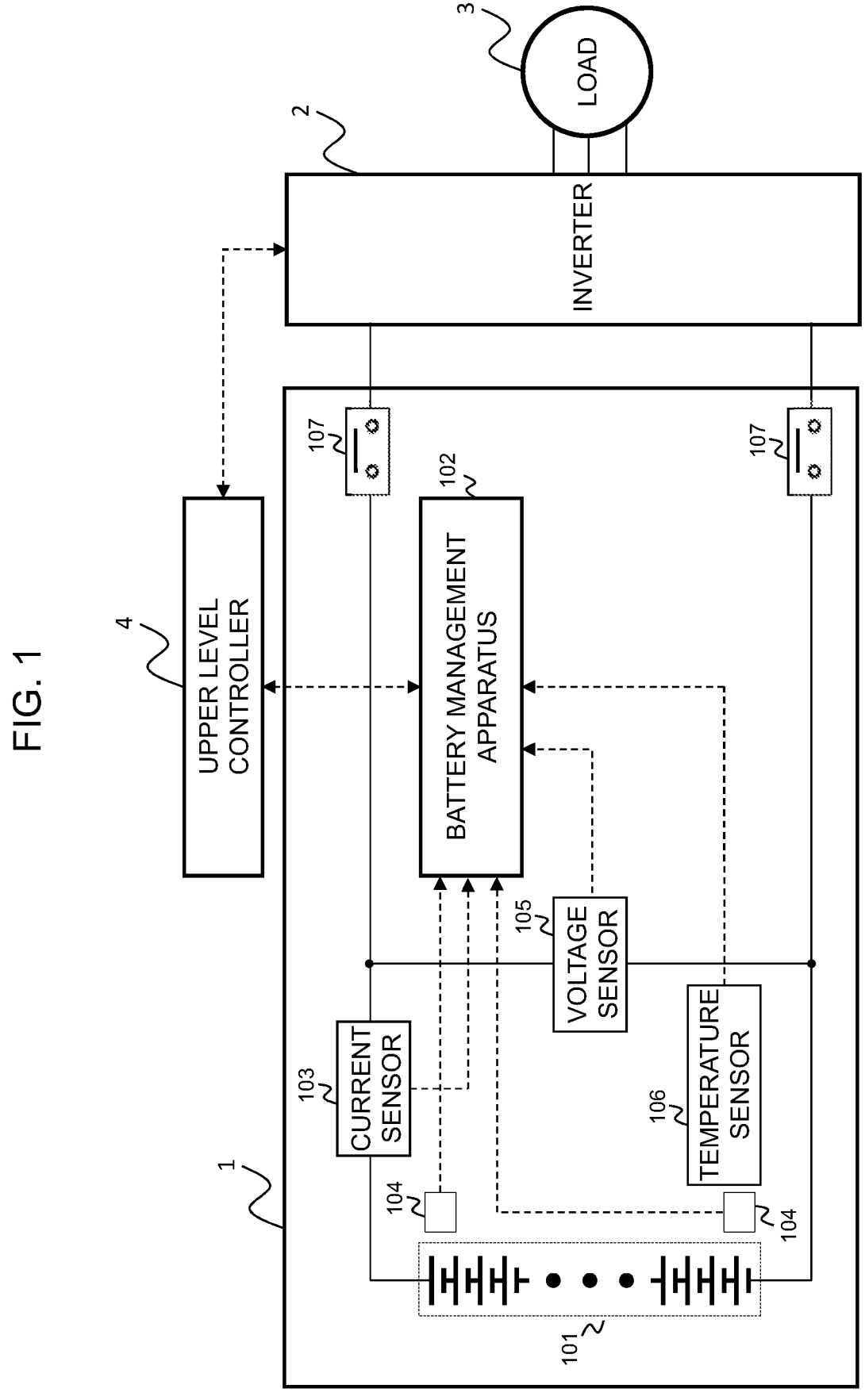
FIG. 1 is a schematic configuration diagram of a battery energy storage system according to one embodiment of the present invention.

FIG. 1 is a schematic configuration diagram of a battery energy storage system according to one embodiment of the present invention. The battery energy storage system (BESS) 1 shown in FIG. 1 includes an assembled battery 101, a battery management apparatus 102, a current sensor 103, a cell controller 104, a voltage sensor 105, a temperature sensor 106, and relays 107. The battery energy storage system 1 is coupled to a load 3, such as an AC motor, via an inverter 2. The battery energy storage system 1 and the inverter 2 are coupled to an upper level controller 4 via a communication circuit, not shown.

The assembled battery 101 includes multiple chargeable and dischargeable battery cells coupled in series and in parallel. For drive operation of the load 3, DC power discharged from the assembled battery 101 is converted by the inverter 2 into AC power, and is supplied to the load 3. For regenerative operation of the load 3, AC power output from the load 3 is converted by the inverter 2 into DC power, with which the assembled battery 101 is charged. Such operation of the inverter 2 charges and discharges the assembled battery 101. The operation of the inverter 2 is controlled by the upper level controller 4.

The current sensor 103 detects current flowing in the assembled battery 101, and outputs the detection result to the battery management apparatus 102. The cell controller 104 detects the voltage of each battery cell of the assembled battery 101, and outputs the detection result to the battery management apparatus 102. The voltage sensor 105 detects the voltage (total voltage) of the assembled battery 101, and outputs the detection result to the battery management apparatus 102. The temperature sensor 106 detects the temperature of the assembled battery 101, and outputs the detection result to the battery management apparatus 102. The relays 107 switches the coupling state between the battery energy storage system 1 and the inverter 2 according to control by the upper level controller 4.

The battery management apparatus 102 controls charge and discharge of the assembled battery 101 based on the detection results of the current sensor 103, the cell controller 104, the voltage sensor 105 and the temperature sensor 106. At this time, the battery management apparatus 102 calculates various types of battery states as indicators that indicate the states of the assembled battery 101. The battery states calculated by the battery management apparatus 102 include, for example, a state of charge (SOC) (specifically, e.g., the charging rate of the battery), a state of health (SOH) (specifically, e.g., the deterioration degree of the battery), the maximum permissible power, and the available energy. By controlling the charge and discharge of the assembled battery 101 by using these battery states, the battery management apparatus 102 safely controls the assembled battery 101. As a result, an upper level system (an electric vehicle, a hybrid vehicle, etc.) provided with the battery energy storage system 1 can be efficiently controlled. The battery management apparatus 102 performs information communication required to control the charge and discharge of the assembled battery 101, with the upper level controller 4.

Note that in this embodiment, the available energy described above is defined as the total amount of electrical energy that the assembled battery 101 can discharge, in the electrical energy accumulated in the assembled battery 101. This corresponds to the total electric energy (Wh) dischargeable without each battery cell falling below the minimum voltage $V_{min}$, until the SOC of each battery cell reaches $SOC_{min}$, which is the minimum SOC value permitted for the corresponding battery cell, in a case where each battery cell of the assembled battery 101 is discharged with a constant discharge current $I_{C0,DCh}$. Note that the discharge current value $I_{C0,DCh}$ is preset depending on the operation mode and the like of the battery energy storage system 1.

Figure 2:
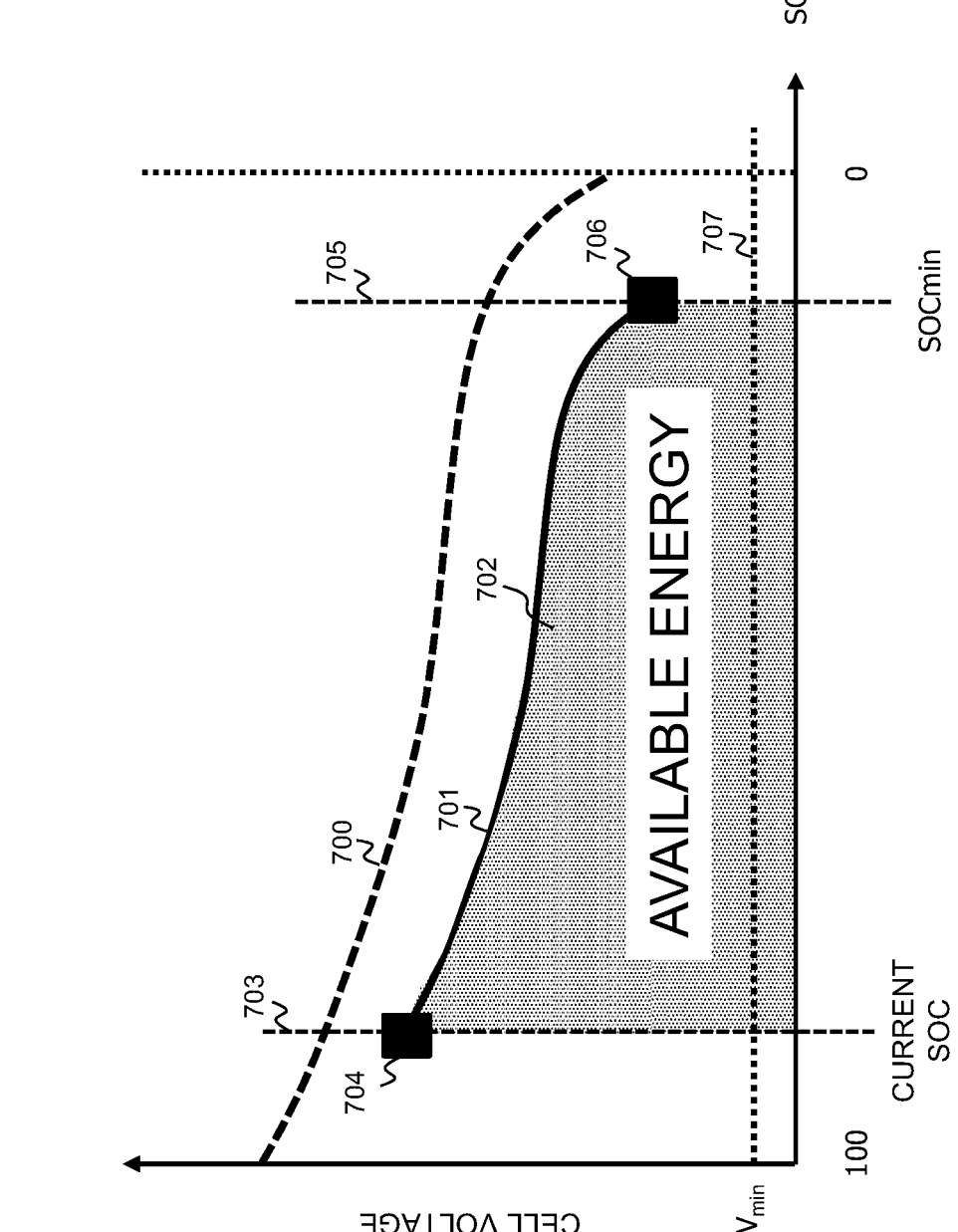
FIG. 2 illustrates available energy.

FIG. 2 illustrates the available energy. In FIG. 2, a broken line indicated by a symbol 700 represents an SOC-OCV curve that indicates the relationship between the SOC and the open-circuit voltage (OCV) of each battery cell of the assembled battery 101. A solid line indicated by a symbol 701 represents a discharge curve when each battery cell of the assembled battery 101 is discharged with the constant discharge current $I_{C0,DCh}$ from the current SOC to $SOC_{min}$. Note that in FIG. 2, the current SOC is indicated by a broken line 703, and the $SOC_{min}$ is indicated by a broken line 705.

The discharge curve 701 indicates the relationship between the SOC and the closed-circuit voltage (CCV) during discharge from each battery cell of the assembled battery 101. That is, the CCV of each battery cell during discharge of the assembled battery 101 continuously changes, according to the discharge curve 701, from the voltage value 704 corresponding to the current SOC to the voltage value 706 corresponding to $SOC_{min}$ when discharge is finished, in a range where the voltage does not fall below the minimum voltage $V_{min}$ indicated by a broken line 707.

Here, provided that the C-rate during discharge corresponding to the discharge curve 701 is represented as $C_0$, the discharge current $I_{C0,DCh}$ can be represented as $I_{C0,DCh}=C_0\times Ah_{rated}$. In this expression, $Ah_{rated}$ represents the rated capacity of each battery cell.

The available energy of each battery cell during discharge is defined by the following (Expression 1).

$$\text{Available energy}=\int_{t_{present}}^{t_{end}}CCV(t)\times I_{C0,DCh}(t)dt \qquad \text{[Expression 1]}$$

In (Expression 1), CCV(t) represents the CCV of each battery cell at a time t, i.e., the value of a discharge voltage, $t_{present}$ represents the current time, and $t_{end}$ represents a time when the SOC of each battery cell reaches $SOC_{min}$ and discharge is finished. This (Expression 1) represents the integral value of the discharge curve 701 from the current SOC to $SOC_{min}$ shown in FIG. 2. That is, in FIG. 2, the area of an area 702 that is encircled by the discharge curve 701 and the broken lines 703 and 705 and is indicated by hatching corresponds to the available energy of each battery cell.

For example, in a case where the battery energy storage system 1 is mounted on a vehicle, the available energy of the assembled battery 101 is required to be calculated in real time in order to achieve appropriate and safe vehicle control. However, during vehicle traveling, the current sequentially changes. Consequently, (Expression 1), which is a calculation expression assuming a constant discharge current $I_{CO,DCh}$, cannot be applied. In one embodiment of the present invention, according to a calculation method described below, the available energy of the assembled battery 101 can be directly calculated in real time without using (Expression 1).

Figure 3:
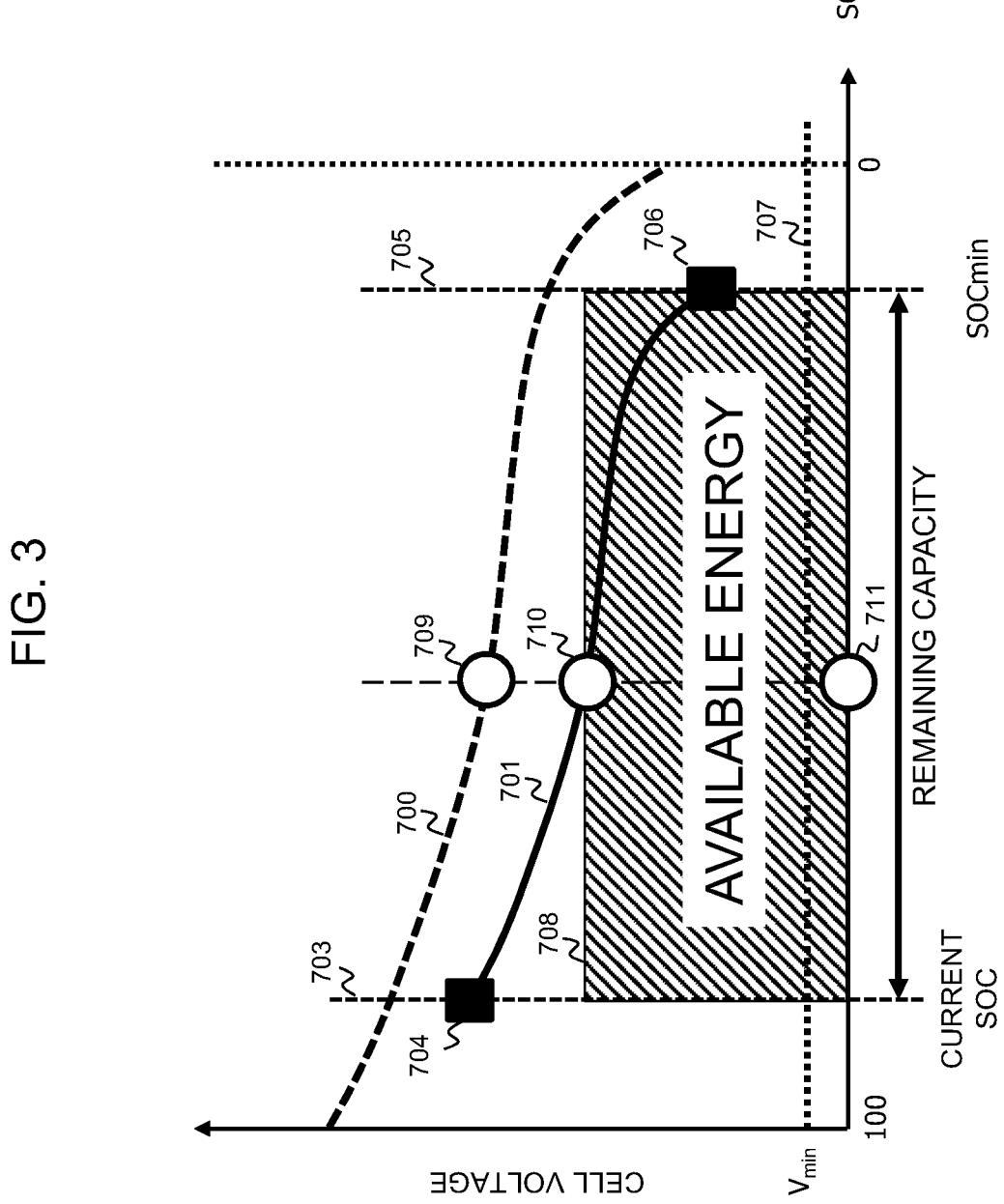
FIG. 3 is a concept diagram of a method of calculating the available energy according to one embodiment of the present invention.

FIG. 3 is a concept diagram of a method of calculating the available energy according to one embodiment of the present invention. In FIG. 3, the SOC-OCV curve 700 and the discharge curve 701 correspond to those in FIG. 2. In FIG. 3, in addition to these curves, an area 708 indicated by hatching is depicted. The area 708 is defined as the remaining capacity of each battery cell, i.e., the area of a rectangle having a long side that is a difference $\Delta SOC$ between the current SOC and $SOC_{min}$, and a short side that is a mid voltage 710 that is present between the voltage value 704 corresponding to the current SOC on the discharge curve 701 and the voltage value 706 corresponding to the $SOC_{min}$ when discharge is finished.

In one embodiment of the present invention, the mid voltage 710 that is present on the discharge curve 701 is obtained such that the area of the area 708 in FIG. 3 matches the area of the area 702 in FIG. 2. Accordingly, the area of the rectangular area 708 by multiplying the mid voltage 710 by the remaining capacity ($\Delta SOC$), thereby allowing the area of this area 702 in FIG. 2, i.e., the available energy, to be calculated.

Note that in FIG. 3, a point 709 on the SOC-OCV curve 700 represents the OCV value (mid OCV) corresponding to the mid voltage 710. The mid OCV is present between the OCV value in the current SOC and the OCV value in the $SOC_{min}$. A point 711 on the abscissa axis represents a SOC value (mid SOC) corresponding to the mid voltage 710 and the mid OCV. The mid SOC is present between the current SOC and the $SOC_{min}$.

The method of calculating the available energy for units of battery cells has been described above. In this embodiment, it is preferable to calculate the available energy for the entire assembled battery 101. For example, for each of the battery cells constituting the assembled battery 101, the available energy is calculated with respect to each battery cell, and the calculation results of the available energy of the individual battery cells are summed up, which can obtain the available energy of the entire assembled battery 101. Alternatively, the available energy may be calculated on an assembled battery 101 basis by applying the calculation method described above to the entire assembled battery 101.

Subsequently, a method of calculating the available energy in this embodiment where the aforementioned concept is specifically implemented is described.

Figure 4:
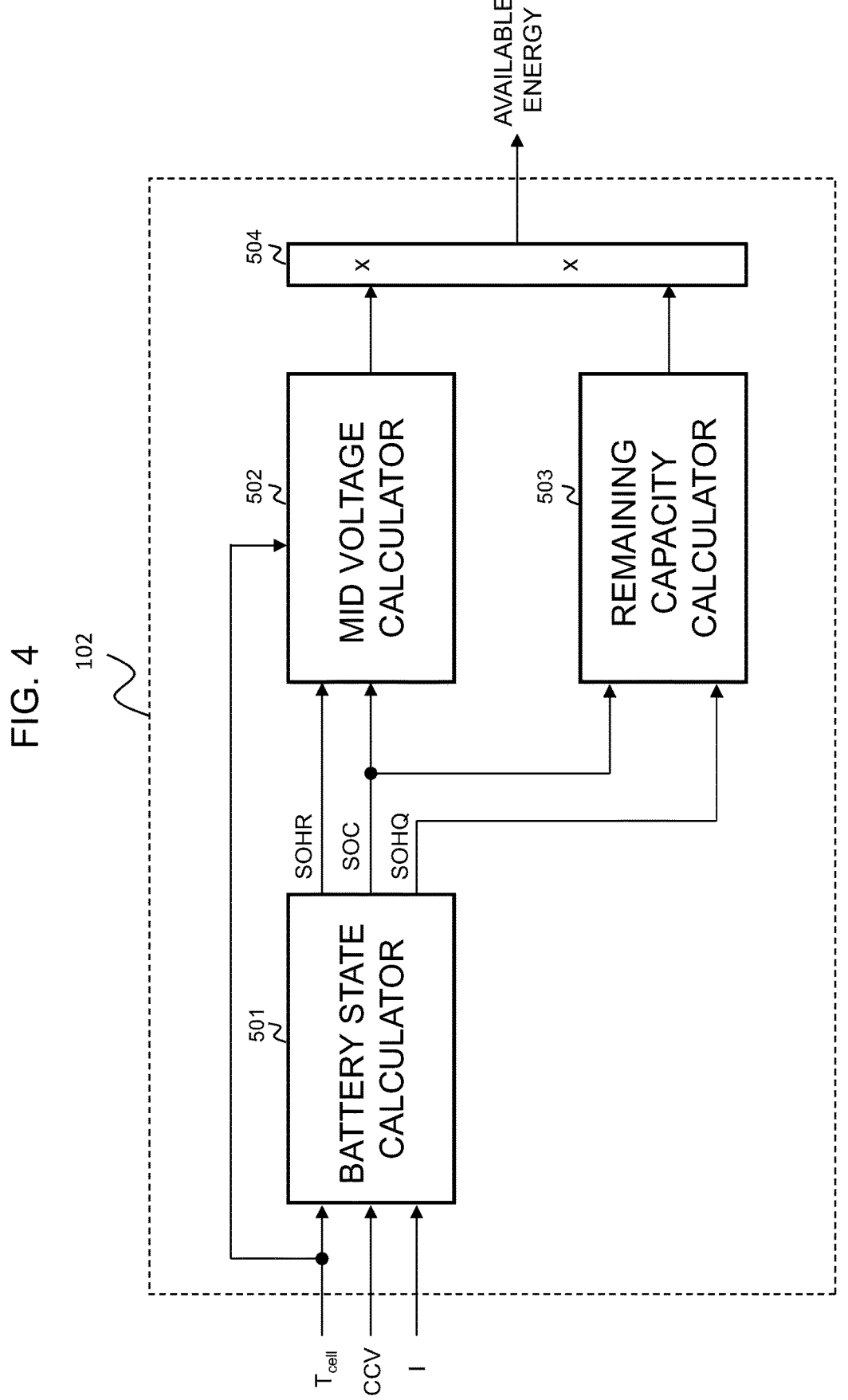
FIG. 4 shows functional blocks of the battery management apparatus pertaining to an available energy calculation process according to a first embodiment of the present invention.

FIG. 4 shows functional blocks of the battery management apparatus 102 pertaining to an available energy calculation process according to a first embodiment of the present invention. The battery management apparatus 102 of this embodiment includes functional blocks including a battery state calculator 501, a mid voltage calculator 502, a remaining capacity calculator 503, and an available energy calculator 504. These functional blocks can be achieved by causing a computer to execute a predetermined program, for example.

The battery state calculator 501 obtains current I, closed-circuit voltage CCV, and battery temperature $T_{cell}$ detected when the assembled battery 101 is charged or discharged, from the current sensor 103, the voltage sensor 105 and the temperature sensor 106, respectively. Based on the pieces of information, state values representing the current state of the assembled battery 101 are calculated; the state values are the open circuit voltage OCV, the state of charge SOC, the polarization voltage Vp, the charge capacity fade SOHQ (specifically, e.g., the deterioration rate of the capacity (e.g., an example of the deterioration degree)), and an internal resistance rise SOHR (specifically, e.g., the increase rate of the internal resistance, in other words, the deterioration rate of the internal resistance (an example of the deterioration degree)). Note that the details of the method of calculating these state values by the battery state calculator 501 are described later with reference to FIG. 5.

The mid voltage calculator 502 obtains the state of charge SOC and the internal resistance rise SOHR among the state values of the assembled battery 101 calculated by the battery state calculator 501, while obtaining the battery temperature $T_{cell}$ from the temperature sensor 106. Based on the obtained pieces of information, the mid voltage 710 described in FIG. 3 is calculated. Note that the details of the method of calculating the mid voltage by the mid voltage calculator 502 are described later with reference to FIG. 7.

The remaining capacity calculator 503 obtains the state of charge SOC and the charge capacity fade SOHQ among the state values of the assembled battery 101 calculated by the battery state calculator 501. Based on the obtained pieces of information, the remaining capacity of the assembled battery 101 at the present time is calculated. Note that the details of the method of calculating the remaining capacity by the remaining capacity calculator 503 are described later.

The available energy calculator 504 calculates the available energy of the assembled battery 101 based on the mid voltage calculated by the mid voltage calculator 502 and the remaining capacity calculated by the remaining capacity calculator 503. Specifically, as represented in the following (Expression 2), the available energy of the assembled battery 101 is calculated by multiplying the mid voltage by the remaining capacity.

$$\text{Available energy (Wh)} = \text{mid voltage (V)} \times \text{remaining capacity (Ah)} \quad \text{(Expression 2)}$$

The available energy of the assembled battery 101 calculated by the battery management apparatus 102 is transmitted from the battery management apparatus 102 to the upper level controller 4, and is used to control the inverter 2. Accordingly, the available energy of the assembled battery 101 is calculated in real time in the battery energy storage system 1, and charge and discharge control of the assembled battery 101 is performed.

Figure 5:
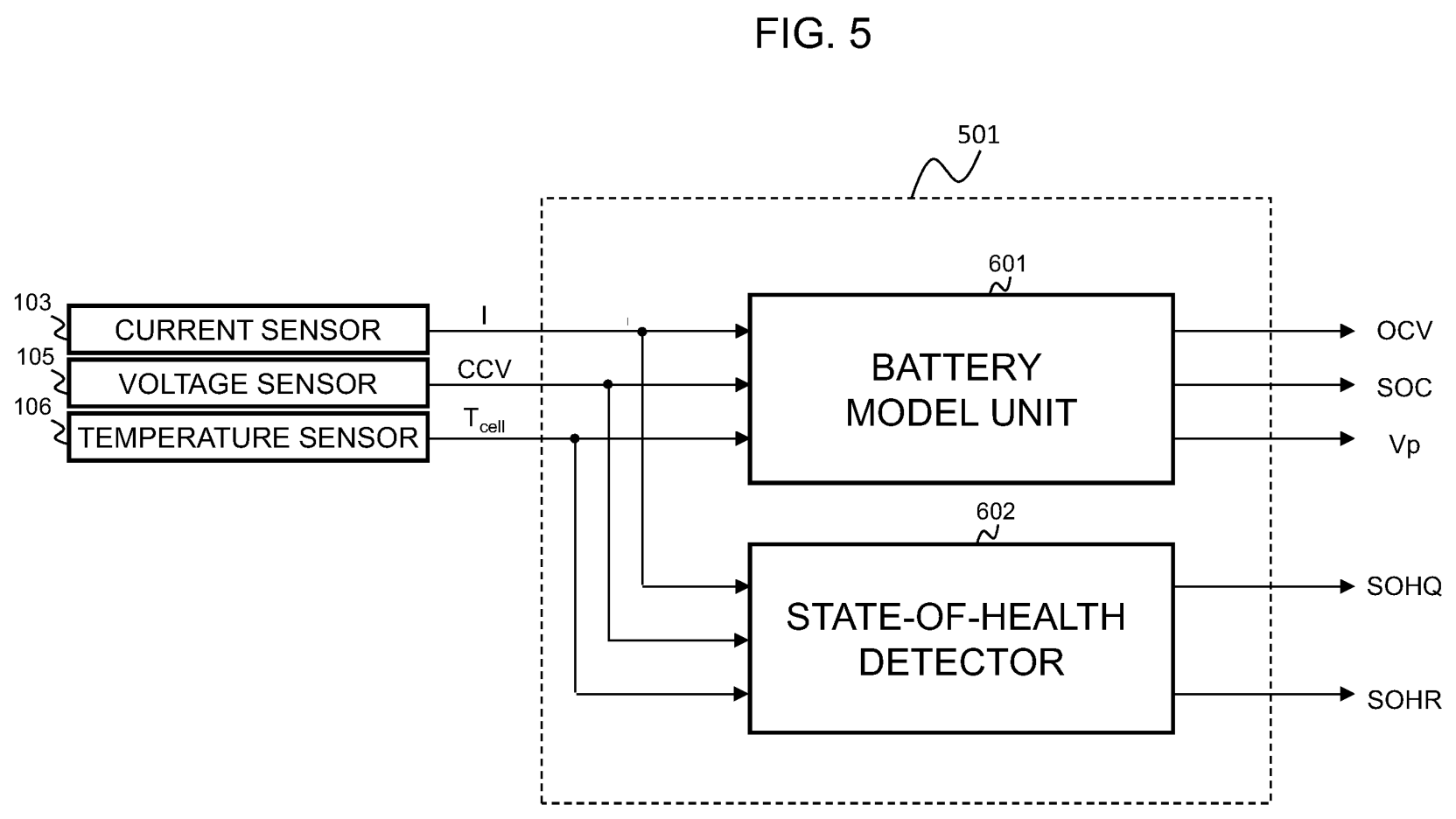

FIG. 5 shows functional blocks of the battery state calculator 501. The battery state calculator 501 includes a battery model unit 601, and a state-of-health detector 602.

The battery model unit 601 stores a battery model obtained by modeling the assembled battery 101, and obtains the open circuit voltage OCV, the state of charge SOC, and the polarization voltage Vp, using this battery model. The battery model in the battery model unit 601 is configured depending on the numbers of serial couplings and parallel couplings of battery cells in the actual assembled battery 101, and the equivalent circuit of each battery cell, for example. The battery model unit 601 can obtain the open circuit voltage OCV, the state of charge SOC and the polarization voltage Vp depending on the state of the assembled battery 101, by applying, to this battery model, the current I, the closed-circuit voltage CCV and the battery temperature $T_{cell}$ obtained respectively from the current sensor 103, the voltage sensor 105 and the temperature sensor 106.

Figure 6:
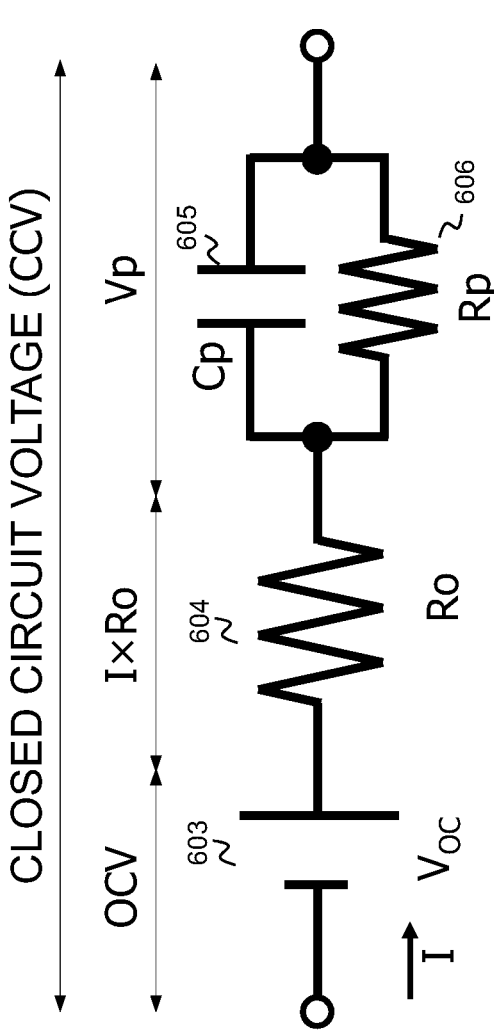
FIG. 6 shows an example of an equivalent circuit of a battery cell in a battery model.

FIG. 6 shows an example of the equivalent circuit of the battery cell in the battery model configured in the battery model unit 601. The equivalent circuit of the battery cell shown in FIG. 6 includes an open voltage source 603 having a voltage value Voc, an internal resistance 604 having a resistance value Ro, and a polarization model as a parallel circuit that includes a polarization capacity 605 having a capacitance value Cp and a polarization resistance 606 having a resistance value Rp; these components are coupled in series. In this equivalent circuit, the voltage across the opposite ends of the open voltage source 603, i.e., the voltage value Voc, corresponds to the open circuit voltage OCV, and the voltage across the opposite ends of the parallel circuit of the polarization capacity 605 and the polarization resistance 606 corresponds to the polarization voltage Vp. A value obtained by adding applied voltage I×Ro at the internal resistance 604 and the polarization voltage Vp when the current I flows through the equivalent circuit, to the open circuit voltage OCV, corresponds to the closed-circuit voltage CCV. Furthermore, the value of each circuit constant in the equivalent circuit in FIG. 6 is defined depending on the battery temperature $T_{cell}$. Accordingly, based on these relationships, the battery model unit 601 can obtain the open circuit voltage OCV and the polarization voltage Vp of the entire assembled battery 101 from the current I, the closed-circuit voltage CCV and the battery temperature $T_{cell}$, and further obtain the state of charge SOC from the calculation result of the open circuit voltage OCV.

Returning to the description on FIG. 5, the state-of-health detector 602 detects the state of health of the assembled battery 101, and obtains the charge capacity fade SOHQ and the internal resistance rise SOHR depending on the state of health. Each battery cell of the assembled battery 101 progressively deteriorates by being repetitively charged and discharged. Depending on the state of health, reduction in charge capacity and increase in internal resistance occur. The state-of-health detector 602 preliminarily stores, for example, information representing the relationship between the current, voltage and temperature and the state of health of the assembled battery 101, and detects the state of health of the assembled battery 101, through use of this information, based on the current I, the closed-circuit voltage CCV and the battery temperature $T_{cell}$ obtained respectively from the current sensor 103, the voltage sensor 105 and the temperature sensor 106. Based on the preliminarily stored relationship between the state of health, charge capacity fade SOHQ and internal resistance rise SOHR, the charge capacity fade SOHQ and internal resistance rise SOHR that correspond to the detection result of the state of health of the assembled battery 101 can be obtained.

As described above, increase in internal resistance occurs depending on the state of health of the assembled battery 101. In a case where the initial resistance value of the internal resistance is represented as Ro,new, and the resistance value of the internal resistance at the current time t is represented as Ro(t), the internal resistance rise SOHR(t) at the current time t is represented by the following Expression (3).

$$SOHR(t) = \{Ro(t)/Ro, new\} \times 100 \qquad \text{(Expression 3)}$$

Figure 7:
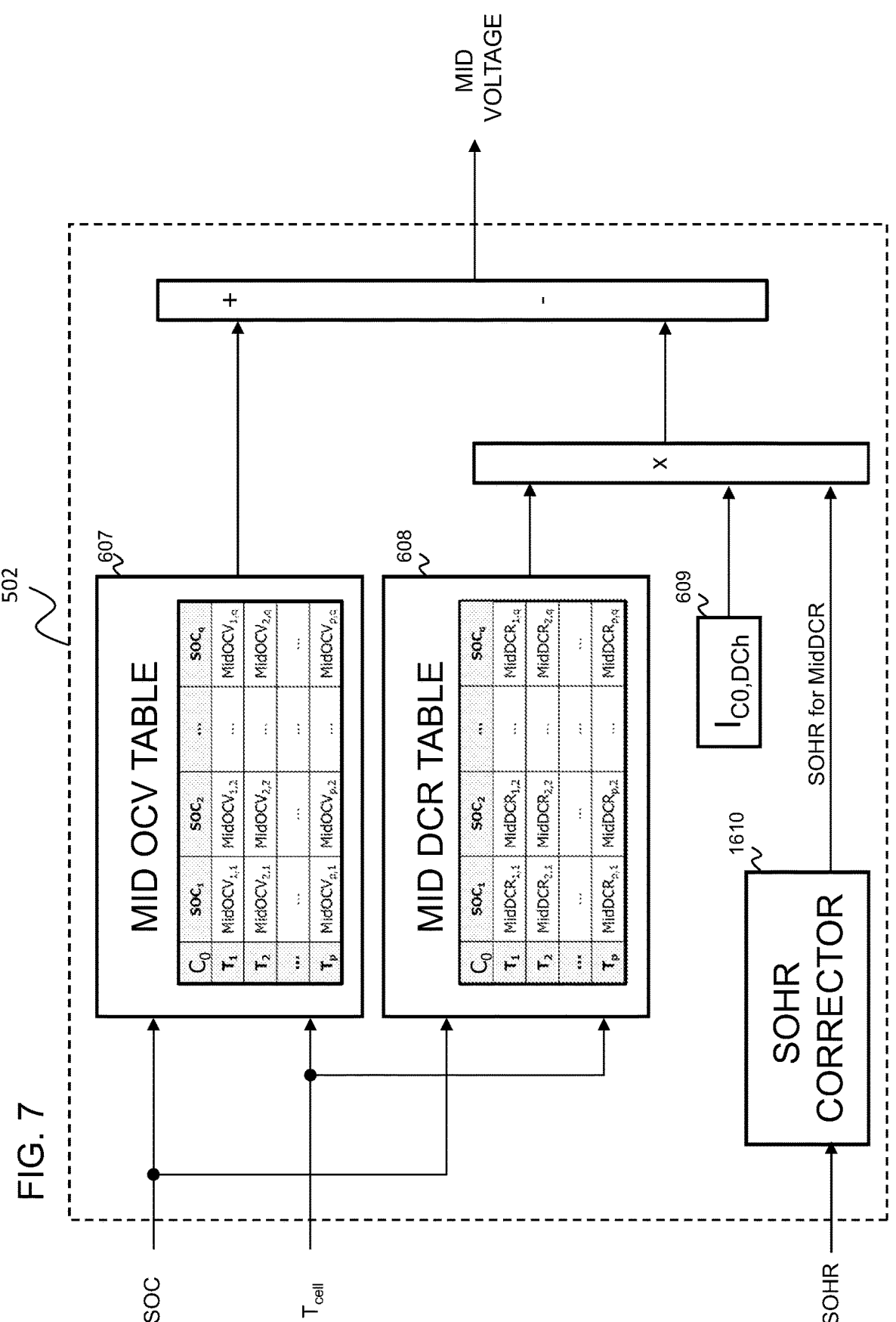
FIG. 7 shows functional blocks of a mid voltage calculator according to the first embodiment of the present invention.

FIG. 7 shows functional blocks of the mid voltage calculator 502 according to the first embodiment of the present invention. The mid voltage calculator 502 includes a mid OCV table 607, a mid DCR table 608, a discharge current setting unit 609, and an SOHR corrector 1610.

The state of charge SOC obtained from the battery state calculator 501, and the battery temperature $T_{cell}$ obtained from the temperature sensor 106 are each input into the mid OCV table 607 and the mid DCR table 608. Based on the input pieces of information, the mid OCV table 607 and the mid DCR table 608 obtain the mid OCV and the mid DCR depending on the current state of the assembled battery 101 through table search. Note that the mid DCR is a DC resistance value of the assembled battery 101 corresponding to the mid voltage.

In the mid OCV table 607, MidOCV indicating the value of the mid OCV is set for each combination of the state of charge SOC and the battery temperature $T_{cell}$. For example, the value of the battery temperature $T_{cell}$ is represented as $T_i$ (i=1 to p), and the value of the state of charge SOC is represented as $SOC_j$ (j=1 to q). With respect to each combination thereof, p×q voltage values $MidOCV_{i,j}$(V) represented by the following (Expression 4) are set in the mid OCV table 607.

$$MidOCV_{i,j} = MidOCV(T_i, SOC_j) \qquad \text{(Expression 4)}$$

In the mid DCR table 608, MidDCR indicating the value of the mid DCR for each combination of the state of charge SOC and the battery temperature $T_{cell}$, is set. For example, the value of the battery temperature $T_{cell}$ is represented as $T_i$ (i=1 to p), and the value of the state of charge SOC is represented as $SOC_j$ (j=1 to q). With respect to each combination thereof, p×q resistance values $MidDCR_{i,j}$(Ω) represented by the following (Expression 5) are set in the mid DCR table 608.

$$MidDCR_{i,j} = MidDCR(T_i, SOC_j) \qquad \text{(Expression 5)}$$

where $1 \leq i \leq p$ and $1 \leq j \leq q$. Each of the values of $MidOCV_{i,j}$ in the mid OCV table 607, and each of the values of $MidDCR_{i,j}$ in the mid DCR table 608 can be preset based on an analysis result on a discharge test result of the assembled battery 101, and on a result of simulation using an equivalent circuit model of the assembled battery 101. For example, these preset values are written into a memory, not shown, included in the battery management apparatus 102, thereby allowing the mid OCV table 607 and the mid DCR table 608 to be formed in the battery management apparatus 102. In a design phase of the battery energy storage system, an experiment of discharge at a C-rate may be performed. In this experiment, the voltage value $MidOCV_{i,j}$ and the resistance value $MidDCR_{i,j}$ may be obtained based on the current value, the voltage value and the battery temperature respectively obtained from the current sensor 103, the voltage sensor 105 and the temperature sensor 106 through the experiment. Although not shown, the mid DCR table 608 may have resistance values $MidDCR_{i,j}$ respectively for Ro and Rp.

The mid voltage calculator 502 obtains what corresponds to the input current state of charge SOC and battery temperature $T_{cell}$ of the assembled battery 101 among the voltage values $MidOCV_{i,j}$ and the resistance values $MidDCR_{i,j}$ represented by (Expression 3) and (Expression 4), from the mid OCV table 607 and the mid DCR table 608, respectively. The mid voltage described with reference to FIG. 3 is calculated by the following (Expression 6), based on the obtained values, the discharge current $I_{C0,DCh}$ preset in the discharge current setting unit 609, and SOHR for MidDCR (corrected SOHR) input from the SOHR corrector 1610.

$$MidVoltage(t)=MidOCV(t)-I_{C0,DCh}\times MidDCR(t)\times \\ SOHR \text{ for } MidDCR(t)/100 \qquad \text{(Expression 6)}$$

In (Expression 6), MidVoltage(t) represents the value of the mid voltage at the current time t. MidOCV(t) and MidDCR(t) respectively represent the values of the mid OCV and the mid DCR at the current time t, and are respectively obtained from the mid OCV table 607 and the mid DCR table 608. SOHR for MidDCR (t) is a value after the value of the internal resistance rise SOHR calculated by the battery state calculator 501 at the time t is corrected by the SOHR corrector 1610, and represents an SOHR value to be used to correct the mid DCR (MidDCR). An example of the open-circuit mid voltage (the open-circuit mid voltage corresponding to the mid voltage) at the current time t is MidOCV(t). An example of the mid dropped voltage (the potential difference between the opposite ends of the battery caused by the mid DCR when a predetermined charge-discharge current is caused to flow) at the current time t is "$I_{C0,DCh}\times MidDCR(t)\times SOHR$ for MidDCR(t)/100" in (Expression 6). The SOHR corrector 1610 is described later.

Note that MidOCV(t) and MidDCR(t) in (Expression 6), i.e., the values of the mid OCV and the mid DCR corresponding to the current state of charge SOC and battery temperature $T_{cell}$, may be obtained, through interpolation, from the mid OCV table 607 and the mid DCR table 608. For example, interpolation using any of various known interpolation methods, such as linear interpolation, Lagrange interpolation, and nearest neighbor interpolation, can be performed. Accordingly, even for a combination of the state of charge SOC and the battery temperature $T_{cell}$ that is not described in the mid OCV table 607 or the mid DCR table 608, an appropriate voltage value and resistance value as the mid OCV and the mid DCR can be obtained.

For example, it is assumed that the values of the state of charge SOC and the battery temperature $T_{cell}$ at the time t are represented as SOC(t) and $T_{cell}(t)$, respectively, and these satisfy the relationships in the following (Expression 7). In this case, MidOCV(t) and MidDCR(t) corresponding to the combination of SOC(t) and $T_{cell}(t)$ are not described in the mid OCV table 607 or the mid DCR table 608.

$$T_i < T_{cell}(t) < T_{i+1}$$

$$SOC_j < SOC(t) < SOC_{j+1} \qquad \text{(Expression 7)}$$

In the case described above, the mid voltage calculator 502 can obtain MidOCV(t) at the time t by the following (Expression 8), through interpolation, from the four types of voltage values corresponding to four combinations that combine $T_i$ or $T_{i+1}$ and $SOC_j$ or $SOC_{j+1}$ in the mid OCV table 607, i.e., $MidOCV_{i,j}$, $MidOCV_{i+1,j}$, $MidOCV_{i,j+1}$ and $MidOCV_{i+1,j+1}$.

$$MidOCV(t)=f(SOC(t),T_{cell}(t),MidOCV_{i,j},Mid- \\ OCV_{i+1,j},MidOCV_{i,j+1},MidOCV_{i+1,j+1}) \qquad \text{(Expression 8)}$$

The mid voltage calculator 502 can obtain MidDCR(t) at the time t by the following (Expression 9), through interpolation, from the four types of resistance values corresponding to four combinations that combine $T_i$ or $T_{i+1}$ and $SOC_j$ or $SOC_{j+1}$ in the mid DCR table 608, i.e., $MidDCR_{i,j}$, $MidDCR_{i+1,j}$, $MidDCR_{i,j+1}$ and $MidDCR_{i+1,j+1}$.

$$MidDCR(t)=g(SOC(t),T_{cell}(t),MidDCR_{i,j},Mid- \\ DCR_{i+1,j},MidDCR_{i,j+1},MidDCR_{i+1,j+1}) \qquad \text{(Expression 9)}$$

In (Expression 8) and (Expression 9), f and g represent interpolation processes executed for the mid OCV table 607 and the mid DCR table 608, respectively. The details of these processes vary depending on the interpolation method in the case of interpolation.

The SOHR corrector 1610 is described in detail. The SOHR corrector 1610 corrects SOHR in order to improve the accuracy of the available energy to be calculated. As a result of earnest investigation on practical application of a battery management apparatus allowing real-time calculation of the available energy of the assembled battery 101 by the inventors of the present application, the following knowledge has been gained. That is, as shown in FIG. 6, an equivalent circuit of a battery cell includes two types of resistors that are of an internal resistance 604 having a resistance value Ro and a polarization resistance 606 having a resistance value Rp. These two types of resistances deteriorate due to repetition of charge and discharge of the assembled battery 101 and at least one of the ambient situations. The deterioration mechanism of the internal resistance 604 having the resistance value Ro, and the deterioration mechanism of the polarization resistance 606 having the resistance value Rp are not completely the same (for example, different by the characteristics of the battery cell (e.g., the material used for the battery cell)). SOHR depends not only on R0 but also on Rp. Consequently, SOHR according to (Expression 3) does not necessarily have a value sufficiently accurate to calculate the mid DCR (MidDCR) after occurrence of deterioration of the resistance. Accordingly, in this embodiment, the SOHR corrector 1610 is provided. The SOHR corrector 1610 corrects the SOHR calculated by the battery state calculator 501. Specifically, an element depending on the different deterioration mechanisms of the internal resistance 604 and the polarization resistance 606 (in other words, an element dependent on the deterioration degree of the DC resistance component of the assembled battery 101 and the deterioration degree of the polarization resistance component of the assembled battery 101) is reflected in the SOHR. The corrected SOHR is used to correct MidDCR obtained from the mid DCR table 608. The corrected SOHR is SOHR for MidDCR described above. Consequently, in (Expression 6), "SOHR for MidDCR(t)/100" corresponds to the correction coefficient for the mid DCR (the correction coefficient corresponding to the corrected SOHR of the assembled battery 101), and "MidDCR(t)×SOHR for MidDCR(t)/100" corresponds to the corrected MidDCR(t) corrected using SOHR for MidDCR(t) (corrected SOHR(t)).

Figure 8:
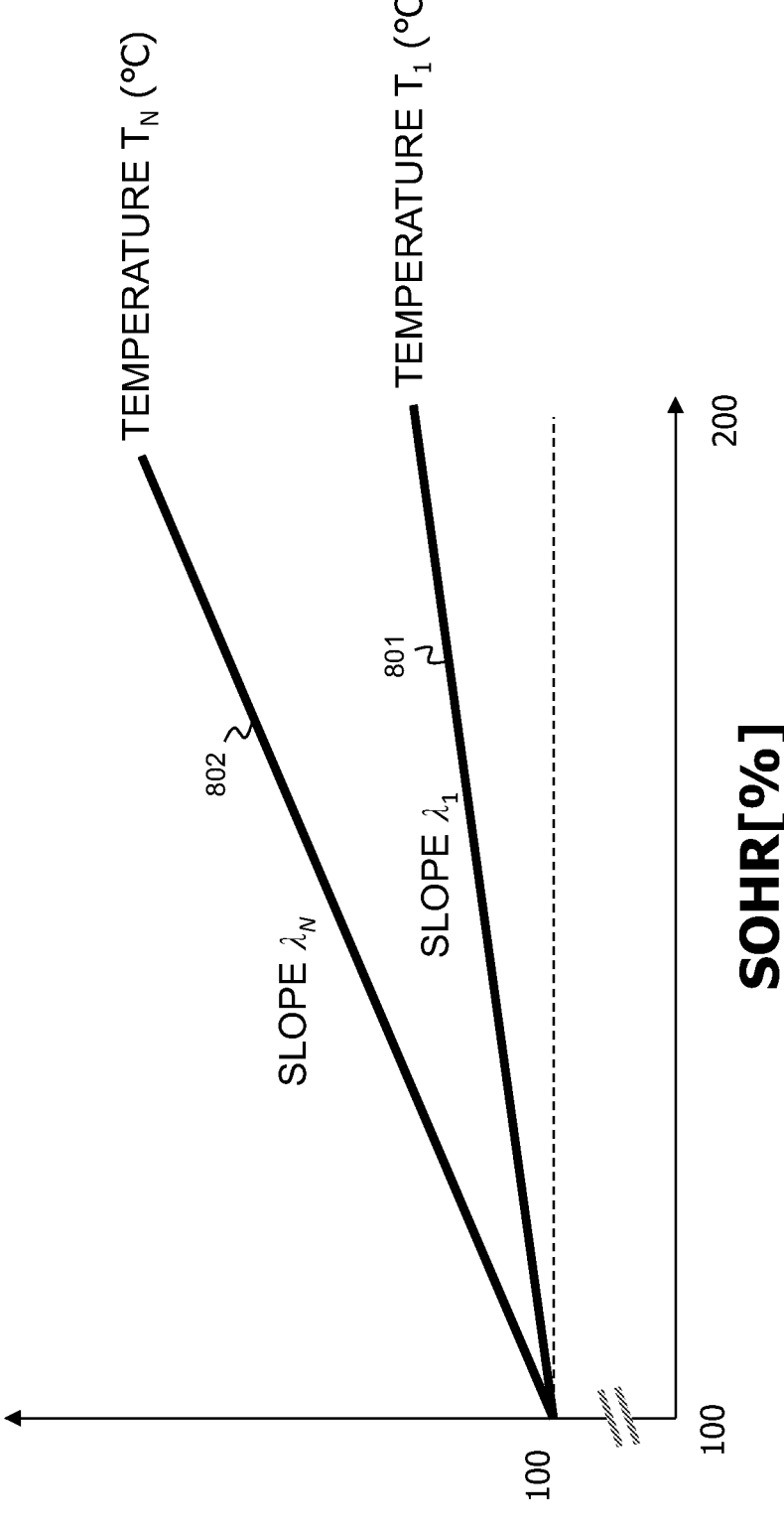
FIG. 8 shows an example of h (an element reflected in SOHR) for each of different battery temperatures.

SOHR for MidDCR(t) (corrected SOHR(t)) is represented by the following (Expression 10).

$$SOHR \text{ for } MidDCR=h(SOHR) \qquad \text{(Expression 10)}$$

h is the element depending on the different deterioration mechanisms of the internal resistance 604 and the polarization resistance 606. FIG. 8 shows an example of h for each of different battery temperatures.

According to discussion by the inventor of the present application, the internal resistance 604 and the polarization resistance 606 are affected by the battery temperature, and SOHR for MidDCR linearly depends on SOHR calculated by the battery state calculator 501. For the battery temperatures $T_1$ and $T_N$ shown in FIG. 8, the following (Expression 11a) and (Expression 11b) hold.

SOHR for MidDCR=$\lambda_1$×SOHR+100, at temperature
$T_1$          (Expression 11a)

SOHR for MidDCR=$\lambda_N$×SOHR+100, at temperature
$T_N$          (Expression 11b)

$\lambda_1$ ($\lambda_1$>0) is the slope of a straight line 801 representing the relationship between SOHR and SOHR for MidDCR at a battery temperature $T_1$. $\lambda_N$ ($\lambda_N$>0) is the slope of a straight line 802 representing the relationship between SOHR and SOHR for MidDCR at a battery temperature $T_N$.

An element h to be reflected in SOHR calculated by the battery state calculator 501 is not limited to the example shown in FIG. 8. The element h may be determined based on the result of analyzing the test result on the assembled battery 101, and on the simulation result on the assembled battery 101.

After MidOCV(t) and MidDCR(t) through interpolation are successfully obtained as described above, the mid voltage calculator 502 applies these values to (Expression 6) described above, thereby allowing the mid voltage MidVoltage(t) at the current time t to be calculated.

The remaining capacity calculator 503 calculates the remaining capacity of the assembled battery 101 by the following (Expression 12) based on the state of charge SOC and the charge capacity fade SOHQ obtained from the battery state calculator 501.

RemainingCapacity(t)=(SOC(t)–SOC$_{min}$)/100×
$Ah_{rated}$×SOHQ(t)/100          (Expression 12)

In (Expression 12), RemainingCapacity(t) represents the value of the remaining capacity at the current time t. $Ah_{rated}$ represents the rated capacity of the assembled battery 101, i.e., the remaining capacity of the assembled battery 101 at the start of use when being fully charged.

The first embodiment of the present invention described above exerts the following working effects.

(1) The battery management apparatus 102 is an apparatus that manages the chargeable and dischargeable assembled battery 101, and includes: the battery state calculator 501 that calculates the state of charge SOC representing the state of charge of the assembled battery 101, the charge capacity fade SOHQ representing the capacity deterioration degree, and the internal resistance rise SOHR representing the resistance deterioration degree; the mid voltage calculator 502 that corrects the calculated SOHR, corrects the mid resistance (MidDCR(t)) corresponding to the mid voltage 710 (MidVoltage(t)) according to the correction coefficient (SOHR for MidDCR(t)/100) in accordance with the corrected resistance deterioration degree (SOHR for MidDCR(t)), and calculates the mid voltage 710 (MidVoltage(t)) present between the voltage value 704 representing the discharge voltage in the current state of charge of the assembled battery 101, and the voltage value 706 representing the discharge voltage in the minimum state of charge SOC$_{min}$ of the assembled battery 101; the remaining capacity calculator 503 that calculates the remaining capacity (RemainingCapacity (t)) of the assembled battery 101 based on the state of charge SOC and the charge capacity fade SOHQ; and the available energy calculator 504 that calculates the available energy of the assembled battery 101 based on the mid voltage and the remaining capacity. Accordingly, the available energy of the assembled battery 101 can be correctly estimated (in particular, the available energy is estimated more correctly than calculation of the available energy of the assembled battery 101 based on the SOHR having not been corrected yet).

(2) The mid voltage calculator 502 calculates the mid voltage (MidVoltage(t)), based on the open-circuit mid voltage MidOCV(t) corresponding to the mid voltage and on the mid dropped voltage (e.g., "$I_{CO,DCh}$× MidDCR(t)×SOHR for MidDCR(t)/100" in Expression (6)) that is the potential difference between the opposite ends of the battery caused by the corrected mid resistance (e.g., "MidDCR(t)×SOHR for MidDCR(t)/100" in Expression (6)) when the predetermined charge-discharge current is caused to flow. Accordingly, it is expected that the accuracy of the mid voltage calculated in accordance with the state of the assembled battery 101 is high.

(3) The corrected resistance deterioration degree (SOHR for MidDCR(t)) depends on both Ro (the resistance value depending on the deterioration degree of the internal resistance 604 of the assembled battery 101) and Rp (the resistance value depending on the deterioration degree of the polarization resistance 606 of the assembled battery 101). Accordingly, it is expected that the accuracy of the calculated available energy is higher than the case where only Ro between Ro and Rp is considered.

(4) The mid voltage calculator corrects the calculated resistance deterioration degree SOHR, by reflecting an element h depending on both the deterioration mechanism of the internal resistance 604 of the assembled battery 101 and the deterioration mechanism of the polarization resistance 606 of the assembled battery 101, in the calculated resistance deterioration degree SOHR. Accordingly, both Ro and Rp are reflected in correction of SOHR. Consequently, the accuracy of SOHR that is an element for calculation of the available energy is improved. As a result, it is expected that the accuracy of the calculated available energy is high.

(5) As shown in FIG. 3, the mid voltage 710 is a voltage at which the value obtained by multiplying the mid voltage 710 by the remaining capacity matches the integral value of the discharge curve 701 representing change in discharge voltage from the current state of charge SOC to the minimum state of charge SOC$_{min}$. The available energy calculator 504 calculates the available energy by multiplying the mid voltage by the remaining capacity using (Expression 2). Accordingly, even when the discharge current changes, the available energy of the assembled battery 101 can be calculated in real time.

(6) The mid voltage calculator 502 includes: the mid OCV table 607 where the voltage value MidOCV$_{i,j}$ is set for each combination of the state of charge SOC and the battery temperature $T_{cell}$ of the assembled battery 101; and the mid DCR table 608 where the resistance value MidDCR$_{i,j}$ is set for each combination of the state of charge SOC and the battery temperature $T_{cell}$ of the assembled battery 101. The voltage value MidOCV(t) and the resistance value MidDCR(t) corresponding to the state of charge SOC(t) calculated by the battery state calculator 501 and the current battery temperature $T_{cell}$(t) of the assembled battery 101 are then obtained from the mid OCV table 607 and the mid DCR table 608. Based on the obtained voltage value MidOCV(t)

and resistance value MidDCR(t), the mid voltage Mid-Voltage(t) is calculated. Accordingly, the mid voltage depending on the state of the assembled battery 101 can be easily and correctly calculated.

(7) The mid voltage calculator 502 can also obtain the voltage value MidOCV(t) and the resistance value MidDCR(t) corresponding to the state of charge SOC(t) calculated by the battery state calculator 501 and the current battery temperature $T_{cell}$(t) of the assembled battery 101, through interpolation, from the mid OCV table 607 and the mid DCR table 608. Accordingly, also for any combination of the state of charge SOC and the battery temperature $T_{cell}$ that is not described in the mid OCV table 607 or the mid DCR table 608, the voltage value MidOCV(t) and the resistance value MidDCR(t) corresponding thereto can be finely obtained.

Second Embodiment

Next, a second embodiment of the present invention is described. In this embodiment, instead of the constant discharge current $I_{C0,DCh}$ described in the first embodiment, a method is described that calculates the available energy of the assembled battery 101 by using discharge current $I_{Ck,DCh}$ determined in consideration of an actual traveling state of a vehicle provided with the assembled battery 101. Note that a configuration of a battery energy storage system according to this embodiment is similar to the battery energy storage system (BESS) 1 in FIG. 1 described in the first embodiment. Accordingly, the description thereof is omitted.

In this embodiment, unlike the discharge current $I_{C0,DCh}$ in the first embodiment, the value of the discharge current $I_{Ck,DCh}$ is not a preset value, and is determined by the battery management apparatus 102 based on an immediately previous traveling state of the vehicle. That is, the available energy of the assembled battery 101 in this embodiment corresponds to the total electric energy (Wh) dischargeable without each battery cell falling below the minimum voltage $V_{min}$, until SOC of each battery cell reaches $SOC_{min}$, which is the minimum SOC value permitted for the corresponding battery cell, in a case where each battery cell of the assembled battery 101 is discharged with the discharge current $I_{Ck,DCh}$.

Figure 9:
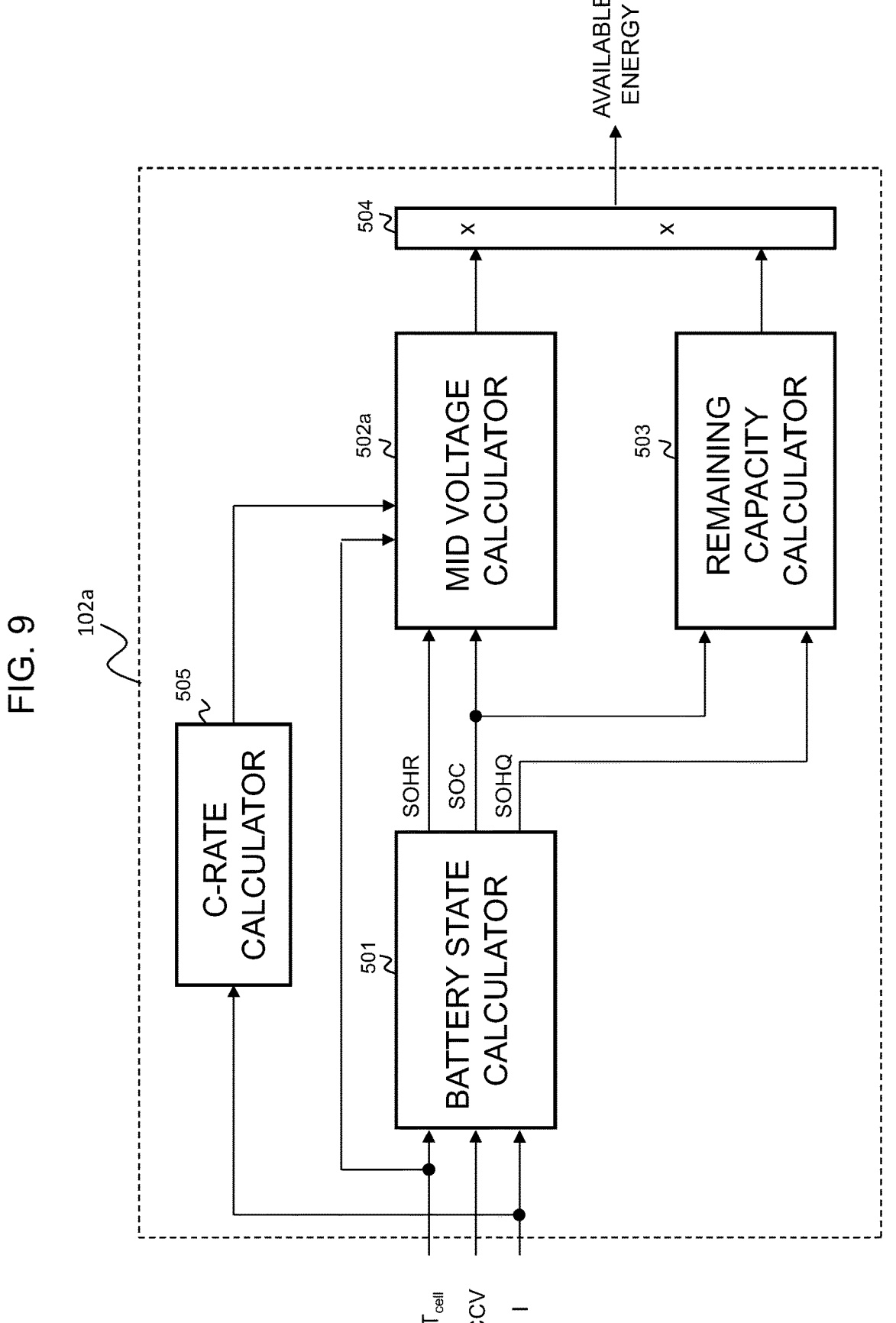
FIG. 9 shows functional blocks of the battery management apparatus pertaining to an available energy calculation process according to a second embodiment of the present invention.

FIG. 9 shows functional blocks of the battery management apparatus 102a pertaining to an available energy calculation process according to the second embodiment of the present invention. The battery management apparatus 102 of this embodiment includes functional blocks including a battery state calculator 501, a mid voltage calculator 502a, a remaining capacity calculator 503, an available energy calculator 504, and a C-rate calculator 505. These functional blocks can be achieved by causing a computer to execute a predetermined program, for example.

The battery state calculator 501, the remaining capacity calculator 503 and the available energy calculator 504 in FIG. 9 are similar to those in the battery management apparatus 102 in FIG. 4 described in the first embodiment. Accordingly, hereinafter, the operations of the mid voltage calculator 502a in FIG. 9 provided instead of the mid voltage calculator 502 in FIG. 2, and the newly provided C-rate calculator 505 are mainly described, and description of the other functional blocks in FIG. 9 is omitted.

The C-rate calculator 505 calculates the C-rate during discharge of the assembled battery 101, i.e., the rate of the magnitude of the discharge current to the capacitance of the assembled battery 101. For example, measured values of discharge current obtained from a predetermined time period before to the present time are averaged, and the average value is divided by the rated capacity of the assembled battery 101, thereby calculating the C-rate during discharge. The value of the C-rate calculated by the C-rate calculator 505 is input into the mid voltage calculator 502a.

The mid voltage calculator 502a obtains the state of charge SOC and the internal resistance rise SOHR among the state values of the assembled battery 101 calculated by the battery state calculator 501, while obtaining the battery temperature $T_{cell}$ from the temperature sensor 106. Furthermore, the C-rate is obtained from the C-rate calculator 505. Based on the obtained pieces of information, the mid voltage 710 described in FIG. 3 in the first embodiment is calculated.

Figure 10:
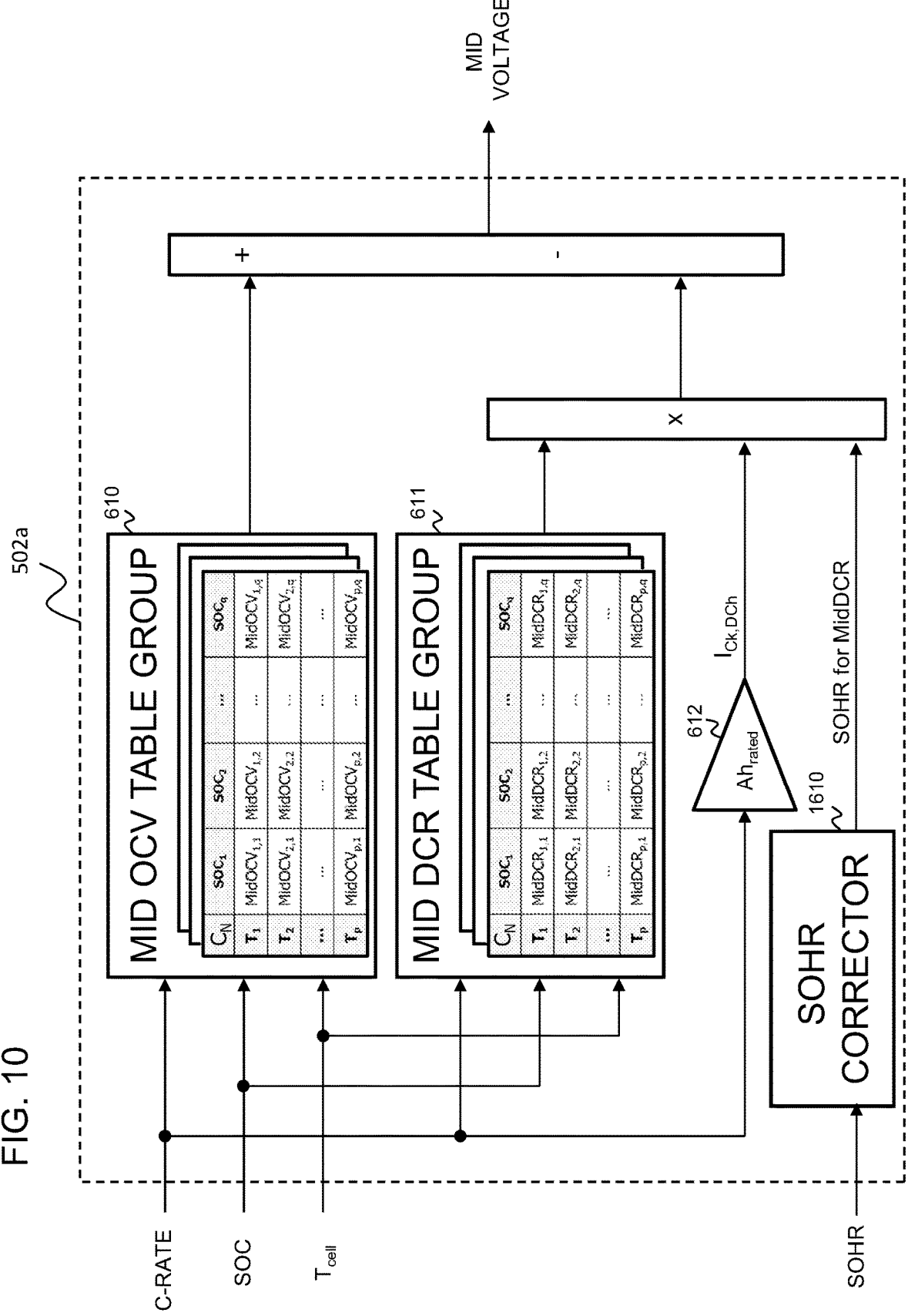
FIG. 10 shows functional blocks of a mid voltage calculator according to the second embodiment of the present invention.

FIG. 10 shows the functional blocks of the mid voltage calculator 502a according to the second embodiment of the present invention. The mid voltage calculator 502a includes a mid OCV table group 610, a mid DCR table group 611, an SOHR corrector 1610, and a gain setting unit 612.

The state of charge SOC obtained from the battery state calculator 501, the battery temperature $T_{cell}$ obtained from the temperature sensor 106 and the C-rate obtained from the C-rate calculator 505 are input into the mid OCV table group 610 and the mid DCR table group 611. Based on the input pieces of information, the mid OCV table group 610 and the mid DCR table group 611 obtain the mid OCV and the mid DCR depending on the current state of the assembled battery 101 through table search.

In the mid OCV table group 610, MidOCV indicating the value of the mid OCV is set for each combination of the C-rate, the state of charge SOC and the battery temperature $T_{cell}$. Specifically, multiple tables in each of which the value of MidOCV is set for each combination of the state of charge SOC and the battery temperature $T_{cell}$, are set depending on the value of the C-rate. For example, it is assumed that the value of the C-rate is represented as $C_k$ (k=1 to N). Tables similar to the mid OCV table 607 described in the first embodiment are set with respect to each $C_k$, and the total number thereof is N. The value of MidOCV in each table is set to a value at the corresponding $C_k$.

Likewise, in the mid DCR table group 611, MidDCR indicating the value of the mid DCR is set for each combination of the C-rate, the state of charge SOC and the battery temperature $T_{cell}$. Specifically, multiple tables in each of which the value of MidDCR is set for each combination of the state of charge SOC and the battery temperature $T_{cell}$, are set depending on the value of the C-rate. That is, as described above, it is assumed that the value of the C-rate is represented as $C_k$ (k=1 to N). Tables similar to the mid DCR table 608 described in the first embodiment are set with respect to each $C_k$, and the total number thereof is N. The value of MidDCR in each table is set to a value at corresponding $C_k$. The value of MidDCR may be provided for both Ro and Rp.

The mid voltage calculator 502a obtains the values of the mid OCV and the mid DCR corresponding to the input current state of charge SOC, battery temperature $T_{cell}$ and value of the C-rate of the assembled battery 101, from the mid OCV table group 610 and the mid DCR table group 611.

The gain setting unit 612 sets the rated capacity $Ah_{rated}$ in (Expression 12) described in the first embodiment, as the gain for the input C-rate. By multiplying the value of the C-rate by the rated capacity $Ah_{rated}$, the discharge current $I_{Ck,DCh}$ is calculated.

The mid voltage calculator 502a calculates the mid voltage described with reference to FIG. 3 by the following (Expression 13) based on the values of the mid OCV and the mid DCR obtained respectively from the mid OCV table group 610 and the mid DCR table group 611, the discharge current $I_{Ck,DCh}$ output from the gain setting unit 612, and the SOHR for MidDCR (corrected SOHR). Here, provided that the value of the C-rate at the current time t is represented as C(t), $I_{Ck,DCh}$=C(t)×Ah$_{rated}$.

$$\text{MidVoltage}(t)=\text{MidOCV}(t)-I_{Ck,DCh}\times\text{MidDCR}(t)\times$$
$$\text{SOHR for MidDCR}(t)/100 \qquad \text{(Expression 13)}$$

Similar to (Expression 6) described in the first embodiment, MidVoltage(t) represents the value of the mid voltage at the current time t in (Expression 13). MidOCV(t) and MidDCR(t) respectively represent the values of the mid OCV and the mid DCR at the current time t, and are respectively obtained from the mid OCV table group 610 and the mid DCR table group 611. SOHR for MidDCR(t) represents the value of corrected SOHR at the time t.

Similar to the first embodiment, also in this embodiment, MidOCV(t) and MidDCR(t) in (Expression 13), i.e., the values of the mid OCV and the mid DCR corresponding to the current state of charge SOC and battery temperature $T_{cell}$, may be obtained, through interpolation, from the mid OCV table group 610 and the mid DCR table group 611. Accordingly, even for a combination of the C-rate, the state of charge SOC and battery temperature $T_{cell}$ that is not described in the mid OCV table group 610 or the mid DCR table group 611, an appropriate voltage value and resistance value as the mid OCV and the mid DCR can be obtained.

For example, it is assumed that the state of charge SOC, the battery temperature $T_{cell}$ and the values of the C-rate at the time t are represented as SOC(t), $T_{cell}$(t) and C(t), respectively, and these satisfy the relationships in the following (Expression 14). In this case, MidOCV(t) and MidDCR(t) corresponding to the combination of SOC(t), $T_{cell}$(t) and C(t) are not described in the mid OCV table group 610 or the mid DCR table group 611.

$$T_i<T_{cell}(t)<T_{i+1}$$

$$\text{SOC}_j<\text{SOC}(t)<\text{SOC}_{j+1}$$

$$C_k<C(t)<C_{k+1} \qquad \text{(Expression 14)}$$

In the above description, first, the mid voltage calculator 502a calculates a table corresponding to C(t), through interpolation, from two tables corresponding to $C_k$ and $C_{k+1}$ in the mid OCV table group 610. In the calculated table, four types of voltage values corresponding to four combinations that combine $T_i$ or $T_{i+1}$ and SOC$_j$ or SOC$_{j+1}$ are extracted as MidOCV$_{i,j}$($C_k$, $C_{k+1}$), MidOCV$_{i+1,j}$($C_k$, $C_{k+1}$), MidOCV$_{i,j+1}$ ($C_k$, $C_{k+1}$), and MidOCV$_{i+1,j+1}$ ($C_k$, $C_{k+1}$). From these voltage values, MidOCV(t) at the time t can be obtained by the following (Expression 15), through interpolation.

$$\text{MidOCV}(t)=f(\text{SOC}(t),T_{cell}(t),\text{MidOCV}_{i,j}(C_k,C_{k+1}),$$
$$\text{MidOCV}_{i+1,j}(C_k,C_{k+1}),\text{MidOCV}_{i,j+1}(C_k,C_{k+1}),$$
$$\text{MidOCV}_{i+1,j+1}(C_k,C_{k+1})) \qquad \text{(Expression 15)}$$

The mid voltage calculator 502a calculates a table corresponding to C(t), through interpolation, from two tables corresponding to $C_k$ and $C_{k+1}$ in the mid DCR table group 611. In the calculated table, four types of resistance values corresponding to four combinations that combine $T_i$ or $T_{i+1}$ and SOC$_j$ or SOC$_{j+1}$ are extracted as MidDCR$_{i,j}$($C_k$, $C_{k+1}$), MidDCR$_{i+1,j}$($C_k$, $C_{k+1}$), MidDCR$_{i,j+1}$($C_k$, $C_{k+1}$), and MidDCR$_{i+1,j+1}$($C_k$, $C_{k+1}$). From these resistance values, MidDCR(t) at the time t can be obtained by the following (Expression 16), through interpolation.

$$\text{MidDCR}(t)=g(\text{SOC}(t),T_{cell}(t),\text{MidDCR}_{i,j}(C_k,C_{k+1}),$$
$$\text{MidDCR}_{i+1,j}(C_k,C_{k+1}), \text{ and } \text{MidDCR}_{i,j+1}(C_k,$$
$$C_{k+1}),\text{MidDCR}_{i+1,j+1}(C_k,C_{k+1})) \qquad \text{(Expression 16)}$$

After MidOCV(t) and MidDCR(t) through interpolation are successfully obtained as described above, the mid voltage calculator 502a applies these values to (Expression 13) described above, thereby allowing the mid voltage MidVoltage(t) at the current time t to be calculated.

According to the aforementioned second embodiment of the present invention, in addition to the working effects (1) and (5) described in the first embodiment, the following working effects are further exerted.

(8) The battery management apparatus 102 includes the C-rate calculator 505 that calculates the C-rate when the assembled battery 101 is discharged. The mid voltage calculator 502a calculates the mid voltage 710 by using the C-rate calculated by the C-rate calculator 505. Accordingly, in consideration of the actual traveling state of the vehicle provided with the assembled battery 101, the mid voltage 710 can be appropriately calculated.

(9) The mid voltage calculator 502a includes: the mid OCV table group 610 where the voltage value MidOCV$_{i,j}$ is set for each combination of the C-rate, the state of charge SOC and the battery temperature $T_{cell}$ of the assembled battery 101; and the mid DCR table group 611 where the resistance value MidDCR$_{i,j}$ is set for each combination of the C-rate, the state of charge SOC and the battery temperature $T_{cell}$ of the assembled battery 101. The voltage value MidOCV(t) and the resistance value MidDCR(t) corresponding to the C-rate value calculated by the C-rate calculator 505, the state of charge SOC(t) calculated by the battery state calculator 501 and the current battery temperature $T_{cell}$(t) of the assembled battery 101 are then obtained from the mid OCV table group 610 and the mid DCR table group 611. Based on the obtained voltage value MidOCV(t) and resistance value MidDCR(t), the mid voltage MidVoltage(t) is calculated. Accordingly, the mid voltage depending on the state of the assembled battery 101 can be easily and correctly calculated.

(10) The mid voltage calculator 502a can also obtain the voltage value MidOCV(t) and the resistance value MidDCR(t) corresponding to the C-rate value C(t) calculated by the C-rate calculator 505, the state of charge SOC(t) calculated by the battery state calculator 501 and the current battery temperature $T_{cell}$(t) of the assembled battery 101, through interpolation, from the mid OCV table group 610 and the mid DCR table group 611. Accordingly, also for any combination of the C-rate, the state of charge SOC and the battery temperature $T_{cell}$ that is not described in the mid OCV table group 610 or the mid DCR table group 611, the voltage value MidOCV(t) and the resistance value MidDCR(t) corresponding thereto can be finely obtained.

Third Embodiment

Next, a third embodiment of the present invention is described. Hereinafter, the difference from the first embodiment is mainly described, and description of points in common with the first embodiment is omitted or simplified.

Figure 11:
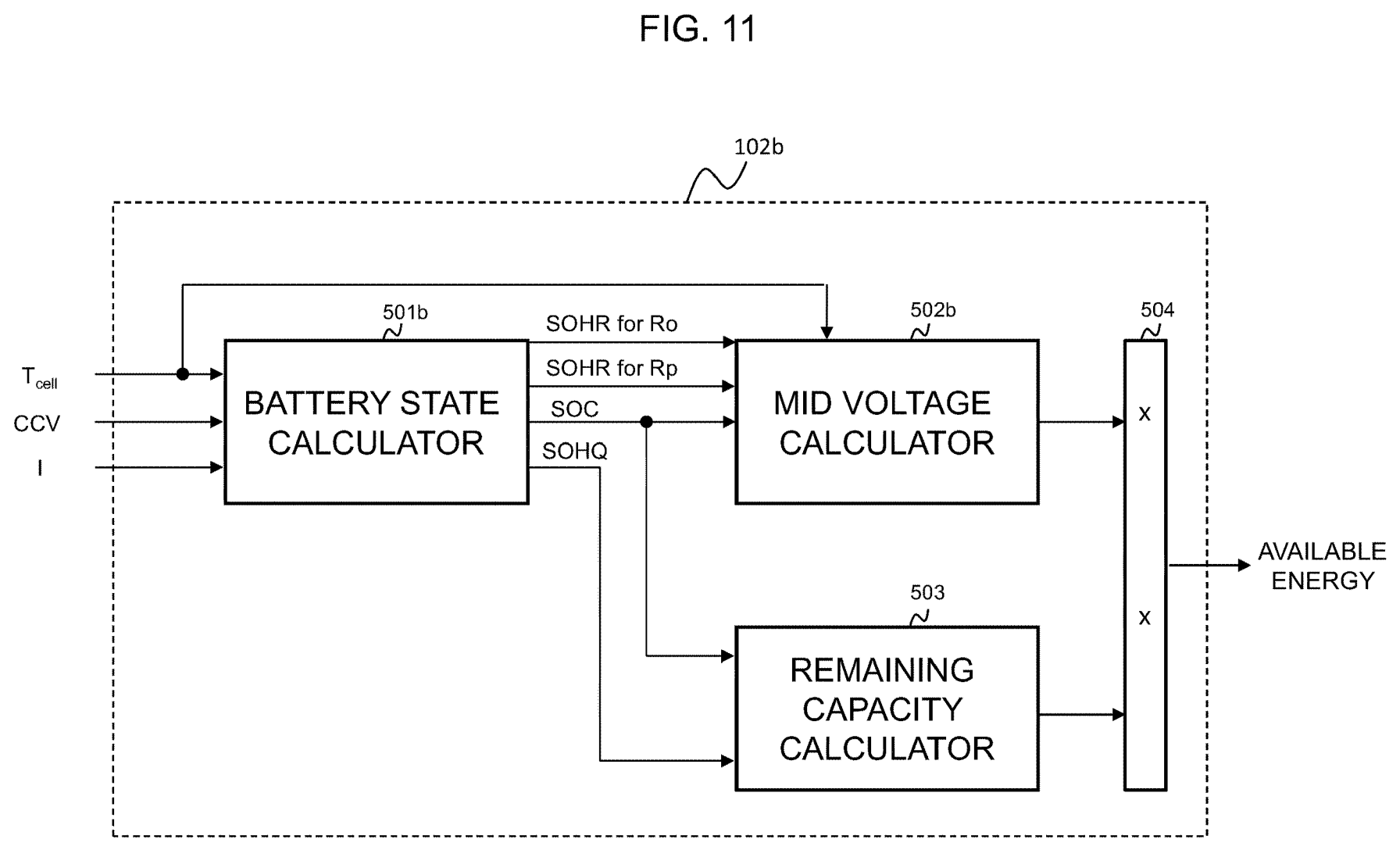

FIG. 11 shows functional blocks of a battery management apparatus 102b pertaining to an available energy calculation process according to the third embodiment of the present invention. The battery management apparatus 102b of this embodiment includes a battery state calculator 501b and a mid voltage calculator 502b respectively instead of the battery state calculator 501 and the mid voltage calculator

502 shown in FIG. 4. These functional blocks can be achieved by causing a computer to execute a predetermined program, for example.

The difference between the battery state calculator 501 and the battery state calculator 501*b* is as follows. That is, the battery state calculator 501*b* calculates SOHR for Ro and SOHR for Rp, instead of SOHR calculated by the battery state calculator 501. SOHR for Ro is SOHR with respect to Ro. SOHR for Rp is SOHR with respect to Rp. For example, SOHR for Ro(t)={Ro(t)/Ro,new}×100, and SOHR for Rp (t)={Rp(t)/Rp,new}×100 may be adopted. SOHR for Ro(t) is SOHR for Ro at the time t. Ro(t) is Ro at the time t. Ro,new is an initial Ro. SOHR for Rp(t) is SOHR for Rp at the time t. Rp(t) is Rp at the time t. Rp,new is an initial Rp.

The difference between the mid voltage calculator 502 and the mid voltage calculator 502*b* is as follows. The mid voltage calculator 502*b* receives SOHR for Ro and SOHR for Rp calculated by the battery state calculator 501*a* instead of SOHR.

Figure 12:
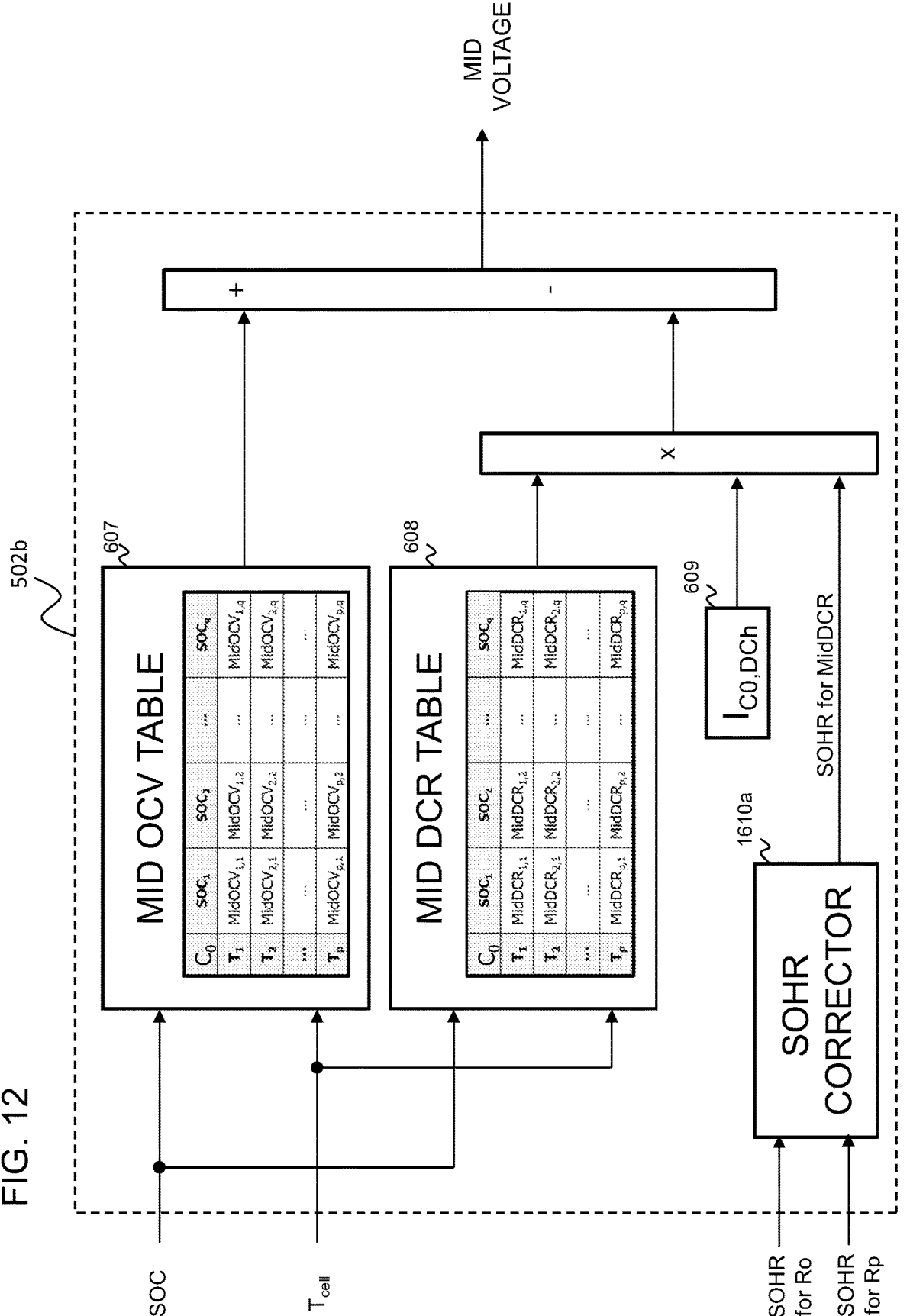
FIG. 12 shows functional blocks of a mid voltage calculator according to the third embodiment of the present invention.

FIG. 12 shows functional blocks of the mid voltage calculator 502*b* according to the third embodiment of the present invention. The mid voltage calculator 502*b* includes an SOHR corrector 1610*a* instead of the SOHR corrector 1610 shown in FIG. 7.

The difference between the SOHR corrector 1610 and the SOHR corrector 1610*a* is as follows. The SOHR corrector 1610*a* receives SOHR for Ro and SOHR for Rp calculated by the battery state calculator 501*a* instead of SOHR. The SOHR corrector 1610*a* calculates SOHR for MidDCR, based on SOHR for Ro and SOHR for Rp. SOHR for MidDCR may be, for example, based on SOHR for Ro and its weight A and on SOHR for Rp and its weight B. The weight A and the weight B may be absolute weights or relative weights. For example, SOHR for MidDCR may be a weighted sum of SOHR for Ro and SOHR for Rp as shown by the following (Expression 13).

$$\text{SOHR\_for MidDCR}=A\times\text{SOHR for }Ro+B\times\text{SOHR\_for }Rp \qquad \text{(Expression 17)}$$

Each of the weights A and B may be a constant, or a variable value changed depending on a parameter, such as the battery temperature. The parameter described here may be, for example, a parameter determined based on the result of the experiment of discharge at the C-rate with various battery deterioration degrees According to the aforementioned second embodiment of the present invention, in addition to the working effects (1) to (7) described in the first embodiment, the following working effects are further exerted.

(11) The calculated resistance deterioration degree SOHR is the internal resistance deterioration degree SOHR for Ro that is the deterioration degree of the internal resistance 604 of the assembled battery 101, and the polarization resistance deterioration degree SOHR for Rp that is the deterioration degree of the polarization resistance 606 of the assembled battery 101. The mid voltage calculator 502*b* calculates the corrected resistance deterioration degree (SOHR for MidDCR), based on the calculated SOHR for Ro and the weight A of SOHR for Ro, and on the calculated SOHR for Rp and the weight B of SOHR for Rp. Accordingly, both Ro and Rp are reflected in the corrected SOHR. Consequently, the accuracy of SOHR that is an element for calculation of the available energy is improved. As a result, it is expected that the accuracy of the calculated available energy is high.

Note that in each embodiment described above, application examples to the battery energy storage systems mounted on electric vehicles, hybrid vehicles and the like have been described. Likewise, the present invention is applicable also to battery energy storage systems used for other applications, for example, battery energy storage systems and the like coupled to a power grid and used.

In each embodiment described above, the method of calculating the available energy when the assembled battery 101 is discharged is described. Alternatively, similar calculation methods are also applicable to chargeable energy when the assembled battery 101 is charged. Here, the chargeable energy is defined as the total amount of electrical energy chargeable when the assembled battery 101 is charged from a certain state of charge. This corresponds to the total electric energy (Wh) with which each battery cell can be charged until SOC of each battery cell reaches $\text{SOC}_{max}$, which is the maximum SOC value permitted for the corresponding battery cell, in a case where each battery cell of the assembled battery 101 is charged with a constant discharge current.

In the case of application to calculation of the chargeable energy, the mid voltage 710 described with reference to FIG. 3 is present between the voltage value corresponding to the current SOC and the voltage value corresponding to $\text{SOC}_{max}$ when charging is completed, on a charge curve representing change in charge voltage from the current SOC of the assembled battery 101 to the $\text{SOC}_{max}$. The mid voltage 710 is then obtained such that a value obtained by multiplying the mid voltage 710 by the chargeable capacity defined as the difference between the current SOC and $\text{SOC}_{max}$ matches the integral value of the charge curve from the current SOC to $\text{SOC}_{max}$. Specifically, the mid voltage during charging can be obtained by using those similar to the mid voltage calculator 502 described in the first embodiment, and the mid voltage calculator 502*a* described in the second embodiment. Note that the mid voltage (CCV) during charging increases in voltage by what is for the internal resistance more than the mid OCV. Accordingly, (Expression 6) and (Expression 13) described above may be changed to the following (Expression 6') and (Expression 13') and used.

$$\text{MidVoltage}(t)=\text{MidOCV}(t)+I_{C0,DCh}\times\text{MidDCR}(t)\times \\ \text{SOHR for MidDCR}(t)/100 \qquad \text{(Expression 6')}$$

$$\text{MidVoltage}(t)=\text{MidOCV}(t)+I_{Ck,DCh}\times\text{MidDCR}(t)\times \\ \text{SOHR for MidDCR}(t)/100 \qquad \text{(Expression 13')}$$

The mid voltage during charging obtained as described above is multiplied by the chargeable capacity obtained by the following (Expression 18), thereby allowing the chargeable energy to be calculated. Note that in (Expression 18), ChargeableCapacity(t) represents the value of the chargeable capacity at the current time t. $\text{Ah}_{rated}$ represents the rated capacity of the assembled battery 101, i.e., the remaining capacity of the assembled battery 101 at the start of use when being fully charged.

$$\text{ChargeableCapacity}(t)=\{(\text{SOC}_{max}-\text{SOC}(t))/100\}\times \\ \text{Ah}_{rated}\times\text{SOHQ for MidDCR}(t)/100 \qquad \text{(Expression 18)}$$

The third embodiment may be applied not only to the first embodiment but also to the second embodiment. Specifically, for example, the battery state calculator 501 in the embodiment in FIG. 2 may be replaced with the battery state calculator 501*b* in the third embodiment. The SOHR corrector 1610 in the second embodiment may be replaced with the SOHR corrector 1610*a* in the third embodiment. In the case where the third embodiment is reflected in the second embodiment, the working effect (11) described above is exerted in addition to the working effects (1) to (5) and (8) to (11) described above.

The present invention is not limited to the embodiments and modified examples described above. Various changes can be made in a range without departing from the spirit of the present invention.

REFERENCE SIGNS LIST

1 Battery energy storage system (BESS)
2 Inverter
3 Load
4 Upper level controller
101 Assembled battery
102, 102a, 102b Battery management apparatus
103 Current sensor
104 Cell controller
105 Voltage sensor
106 Temperature sensor
107 Relay
501, 501a Battery state calculator
502, 502a, 502b Mid voltage calculator
503 Remaining capacity calculator
504 Available energy calculator
505 C-rate calculator
601 Battery model unit
602 State-of-health detector
603 Open voltage source
604 Internal resistance
605 Polarization capacity
606 Polarization resistance
607 Mid OCV table
608 Mid DCR table
609 Discharge current setting unit
610 Mid OCV table group
611 Mid DCR table group
612 Gain setting unit
1610, 1610a SOHR corrector

The invention claimed is:

1. A battery management apparatus, for improving accuracy in calculating a mid voltage of a battery that is chargeable and dischargeable and efficiently controlling the battery, comprising:
   a battery state calculator that calculates a state of charge, a capacity deterioration degree, and a resistance deterioration degree of the battery;
   a mid voltage calculator that corrects the calculated resistance deterioration degree, corrects a mid resistance of the battery corresponding to the mid voltage according to a correction coefficient in accordance with the corrected resistance deterioration degree, and calculates the mid voltage that is present between a charge-discharge voltage in a current state of charge of the battery, and a charge-discharge voltage in a minimum state of charge or a maximum state of charge of the battery, based on the corrected mid resistance;
   a remaining capacity calculator that calculates a remaining capacity or a chargeable capacity of the battery, based on the state of charge and the capacity deterioration degree; and
   an available energy calculator that calculates available energy or chargeable energy of the battery, based on the mid voltage and the remaining capacity, or on the mid voltage and the chargeable capacity, and wherein the battery management apparatus controls a charge or a discharge of the battery based on the available energy or the chargeable energy.

2. The battery management apparatus according to claim 1,
   wherein the mid voltage calculator calculates the mid voltage, based on an open-circuit mid voltage corresponding to the mid voltage, and on a mid dropped voltage that is a potential difference between opposite ends of the battery caused by the corrected mid resistance when a predetermined charge-discharge current is caused to flow.

3. The battery management apparatus according to claim 1,
   wherein the corrected resistance deterioration degree depends on both a deterioration degree of an internal resistance of the battery and on a deterioration degree of a polarization resistance of the battery.

4. The battery management apparatus according to claim 3,
   wherein the mid voltage calculator corrects the calculated resistance deterioration degree, by reflecting an element depending on both a deterioration mechanism of the internal resistance of the battery and a deterioration mechanism of the polarization resistance of the battery, in the calculated resistance deterioration degree.

5. The battery management apparatus according to claim 3,
   wherein the calculated resistance deterioration degree is an internal resistance deterioration degree that is the deterioration degree of the internal resistance of the battery, and a polarization resistance deterioration degree that is the deterioration degree of the polarization resistance of the battery, and
   the mid voltage calculator calculates the corrected resistance deterioration degree, based on the calculated internal resistance deterioration degree, a weight of the calculated internal resistance deterioration degree, the calculated polarization resistance deterioration degree, and a weight of the polarization resistance deterioration degree.

6. The battery management apparatus according to claim 1,
   wherein the mid voltage is a voltage at which a value obtained by multiplying the mid voltage by the remaining capacity or the chargeable capacity matches an integral value of a charge and discharge curve representing change in the charge-discharge voltage from the current state of charge to the minimum state of charge or the maximum state of charge, and
   the available energy calculator calculates the available energy or the chargeable energy by multiplying the mid voltage by the remaining capacity or the chargeable capacity.

7. The battery management apparatus according to claim 1,
   wherein the mid voltage calculator
   includes: a first table in which a voltage value is set for each combination of the state of charge and a temperature of the battery; and a second table in which a resistance value is set for each combination of the state of charge and the temperature of the battery,
   obtains the voltage value and the resistance value corresponding to the state of charge calculated by the battery state calculator and the current temperature of the battery, respectively from the first table and the second table, and calculates the mid voltage, based on the obtained voltage value and resistance value.

8. The battery management apparatus according to claim 7, wherein the mid voltage calculator obtains the voltage value and the resistance value corresponding to the state of charge calculated by the battery state calculator and the current temperature of the battery, through interpolation, respectively from the first table and the second table.

9. The battery management apparatus according to claim 1, further comprising a C-rate calculator that calculates a C-rate when the battery is charged or discharged, wherein the mid voltage calculator calculates the mid voltage by using the C-rate calculated by the C-rate calculator.

10. The battery management apparatus according to claim 9, wherein the mid voltage calculator includes: a first table in which a voltage value is set for each combination of the C-rate and the state of charge and a temperature of the battery; and a second table in which a resistance value is set for each combination of the C-rate and the state of charge and the temperature of the battery, obtains the voltage value and the resistance value corresponding to the C-rate calculated by the C-rate calculator, the state of charge calculated by the battery state calculator, and the current temperature of the battery, respectively from the first table and the second table, and calculates the mid voltage, based on the obtained voltage value and the resistance value.

11. The battery management apparatus according to claim 10, wherein the mid voltage calculator obtains the voltage value and the resistance value corresponding to the C-rate calculated by the C-rate calculator, the state of charge calculated by the battery state calculator, and the current temperature of the battery, through interpolation, respectively from the first table and the second table.

12. A battery energy storage system, comprising:

the battery management apparatus according to claim 1;

a chargeable and dischargeable battery; and a charge-discharge apparatus that charges and discharges the battery, based on available energy or chargeable energy of the battery calculated by the battery management apparatus.

13. A battery management method, for improving accuracy in calculating a mid voltage of a battery that is chargeable and dischargeable and efficiently controlling the battery, the method comprising, by a computer:

calculating a state of charge, a capacity deterioration degree and a resistance deterioration degree of the battery;

correcting the calculated resistance deterioration degree;

correcting a mid resistance of the battery corresponding to a mid voltage, according to a correction coefficient in accordance with the corrected resistance deterioration degree;

calculating the mid voltage that is present between a charge-discharge voltage in a current state of charge of the battery, and a charge-discharge voltage in a minimum state of charge or a maximum state of charge of the battery, based on the corrected mid resistance;

calculating a remaining capacity or a chargeable capacity of the battery, based on the calculated state of charge and capacity deterioration degree;

calculating available energy or chargeable energy of the battery, based on the calculated mid voltage and remaining capacity, or on the calculated mid voltage and chargeable capacity; and controlling a charge or a discharge of the battery based on the available energy or the chargeable energy.

* * * * *